US012534559B2

(12) United States Patent
Okaniwa et al.

(10) Patent No.: US 12,534,559 B2
(45) Date of Patent: Jan. 27, 2026

(54) RESIN COMPOSITION, RESIN SHEET, LAMINATE, SEMICONDUCTOR WAFER WITH RESIN COMPOSITION LAYER, SUBSTRATE FOR MOUNTING SEMICONDUCTOR WITH RESIN COMPOSITION LAYER, AND SEMICONDUCTOR DEVICE

(71) Applicant: MITSUBISHI GAS CHEMICAL COMPANY, INC., Tokyo (JP)

(72) Inventors: Masashi Okaniwa, Tokyo (JP); Kentaro Takano, Tokyo (JP); Tsuyoshi Kida, Tokyo (JP)

(73) Assignee: MITSUBISHI GAS CHEMICAL COMPANY, INC., Tokyo (JP)

( * ) Notice: Subject to any disclaimer, the term of this patent is extended or adjusted under 35 U.S.C. 154(b) by 1065 days.

(21) Appl. No.: 17/620,999

(22) PCT Filed: Jun. 26, 2020

(86) PCT No.: PCT/JP2020/025148
§ 371 (c)(1),
(2) Date: Dec. 20, 2021

(87) PCT Pub. No.: WO2020/262585
PCT Pub. Date: Dec. 30, 2020

(65) Prior Publication Data
US 2022/0380508 A1 Dec. 1, 2022

(30) Foreign Application Priority Data
Jun. 28, 2019 (JP) ................................. 2019-122395

(51) Int. Cl.
C08F 290/06 (2006.01)
C08F 222/40 (2006.01)
C08K 3/36 (2006.01)
H01L 23/29 (2006.01)

(52) U.S. Cl.
CPC .......... *C08F 290/06* (2013.01); *C08F 222/40* (2013.01); *C08K 3/36* (2013.01); *H01L 23/293* (2013.01); *C08K 2201/003* (2013.01)

(58) Field of Classification Search
CPC .. C08F 222/36; C08F 222/40; C08F 222/402; C08F 222/04; C08F 222/406; C08F 222/408; C08L 33/24; C08L 35/00
See application file for complete search history.

(56) References Cited

U.S. PATENT DOCUMENTS

2010/0063184 A1* 3/2010 Dershem ................ C09J 135/06
525/185
2013/0026660 A1 1/2013 Czubarow et al.
2014/0242757 A1 8/2014 Yoko et al.
2016/0040045 A1 2/2016 Morita et al.
2017/0309844 A1 10/2017 Saeki et al.
2018/0355231 A1* 12/2018 Litke ...................... C09J 179/08
2019/0281697 A1 9/2019 Abe et al.
2020/0109292 A1 4/2020 Motomura
2021/0301133 A1 9/2021 Mizori

FOREIGN PATENT DOCUMENTS

| JP | 2003-141936 A | 5/2003 |
|---|---|---|
| JP | 2003-221443 A | 8/2003 |
| JP | 2006-245242 A | 9/2006 |
| JP | 2011-157529 A | 8/2011 |
| JP | 2011-245675 A | 12/2011 |
| JP | 2013-8800 A | 1/2013 |
| JP | 2013-112730 A | 6/2013 |
| JP | 2014-1289 A | 1/2014 |
| JP | 2014-521754 A | 8/2014 |
| JP | 2014-203964 A | 10/2014 |
| JP | 2015-503220 A | 1/2015 |
| JP | 2016-196548 A | 11/2016 |
| JP | 2018-160566 A | 10/2018 |
| JP | 2018-195823 A | 12/2018 |
| JP | 2019-29599 A | 2/2019 |
| WO | 2018/056466 A1 | 3/2018 |
| WO | 2018/237377 A | 12/2018 |

OTHER PUBLICATIONS

International Search Report and Written Opinion of the International Searching Authority issued in International Patent Application No. PCT/JP2020/025148, dated Sep. 1, 2020.

* cited by examiner

*Primary Examiner* — Jeffrey S Lenihan
(74) *Attorney, Agent, or Firm* — GREENBLUM & BERNSTEIN, P.L.C.

(57) ABSTRACT

A resin composition containing a bismaleimide compound (A) containing a constituent unit represented by the following formula (1) and maleimide groups at both ends of the molecular chain, a radical polymerizable resin or compound (B) other than the bismaleimide compound (A), and a curing accelerator (C), wherein the radical polymerizable resin or compound (B) contains at least one selected from the group consisting of a citraconimide group, a vinyl group, a maleimide group, a (meth)acryloyl group and an allyl group.

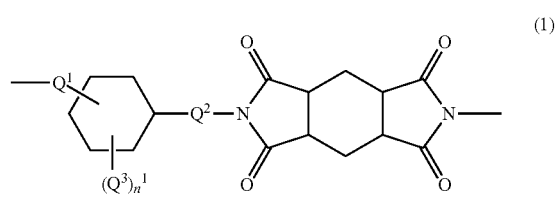

32 Claims, No Drawings

RESIN COMPOSITION, RESIN SHEET, LAMINATE, SEMICONDUCTOR WAFER WITH RESIN COMPOSITION LAYER, SUBSTRATE FOR MOUNTING SEMICONDUCTOR WITH RESIN COMPOSITION LAYER, AND SEMICONDUCTOR DEVICE

TECHNICAL FIELD

The present invention relates to a resin composition, a resin sheet, a laminate using the resin composition, a semiconductor wafer with a resin composition layer, a substrate for mounting a semiconductor with a resin composition layer, and a semiconductor device. In more detail, the present invention relates to a resin composition that is useful as an underfill material.

BACKGROUND ART

In recent years, in association with the downsizing and performance improvement of a semiconductor device, flip chip bonding is getting a lot of attention as a method for mounting a semiconductor chip (hereinafter, may be abbreviated as "a chip") on a substrate for mounting a semiconductor (hereinafter, may be abbreviated as the "substrate"). In the flip chip bonding, a construction method is common in which, after joining the chip and the substrate, the gap between the chip and the substrate is filled with an underfill material, which is then cured. However, due to the downsizing and performance improvement of the semiconductor device, the electrode pitch arranged on the chip has become narrower and the gap between the electrodes has also become narrower. As a result, there have been problems that operability is worsened due to a longer time for filling the underfill material, and that filling failures occur, such as unfilling. In response to this, a construction method has been examined in which, after supplying a pre-applied underfill material to the chip or substrate, the joint of the chip and the substrate and the filling of the underfill material are carried out at the same time.

Since the underfill material is a member that comes into direct contact with the chip and the substrate, as important characteristics required for the underfill material, mention may be made of suppressing the parts unfilled with the underfill material between the chip, and the substrate and the underfill material (hereinafter, may be abbreviated as "a low-void property"), and good adhesiveness between the chip, and the substrate and the underfill material (hereinafter, may be abbreviated as "chip adhesiveness") in an environment where the semiconductor device is produced and used. When a pre-applied underfill material is used, low tackiness is required from the viewpoint of the handleability of the underfill material. Further, since the position accuracy of bonding points between the chip and the substrate is needed, the transmittivity of the underfill material is also required as visibility of alignment marks of the chip and the substrate.

Patent Document 1 describes a pre-applied underfill material that uses a radical polymerizable monomer as the main resin. In Patent Document 1, there is a description that a silane coupling agent is compounded for the purpose of improving the chip adhesiveness.

Patent Document 2 describes an underfill material containing an epoxy resin, an imidazole compound, and a maleimide compound.

Patent Document 3 describes a pre-applied underfill material using an epoxy compound and a carboxyl group containing flux component, and mentions adhesion.

Patent Document 4 describes a resin composition containing a maleimide compound, an epoxy resin, and an epoxy resin curing agent as essential components, and describes that high adherence was obtained in the resin composition after thermosetting.

Patent Document 5 describes a resin composition for printed wiring substrates, the resin composition being a thermosetting resin composition used for forming an insulating layer in a printed wiring substrate, and containing a maleimide compound having a specific structure, a benzoxazine compound, and an inorganic filler.

Patent Document 6 describes an adhesive for electronic components, containing an aliphatic epoxy compound and a benzoxazine compound as the curing base compounds, and also containing a phenolic curing agent.

Patent Document 7 describes an adhesive composition containing a thermosetting compound, a polymer having a functional group that is capable of reacting with the thermosetting compound, and a thermosetting agent, wherein the adhesive composition has a melt viscosity at a bonding temperature of 10 Pa·s to 15000 Pa·s, a gelling time at a bonding temperature of 10 seconds or longer, and a gelling time at 240° C. of 1 second to 10 seconds.

Patent Document 8 describes a method for producing a semiconductor device using a sheet-shaped thermosetting resin composition.

Patent Document 9 describes an underfill insulating film comprising specific amounts of at least one resin component selected from a phenoxy resin, a polyimide resin, a polyamide imide resin, a polyamide resin and an acrylic resin, an epoxy resin, thermal radical polymerizable substance and a thermal radical generating agent.

Patent Document 10 describes an underfill insulating film for gang bonding process which has a melt viscosity at 120° C. ($\eta^*_1$) of $2\times10^2$ Pa·s to $2\times10^4$ Pa·s and a melt viscosity at 140° C. ($\eta^*_2$) of $3\times10^2$ Pa·s to $3\times10^5$ Pa·s when heated at 10° C./min from 60° C. in measurement using a dynamic viscoelasticity measurement apparatus.

Patent Document 11 describes an underfill material comprising a specific amount of an acrylic polymer, an acrylic monomer and a specific amount of a maleimide compound, the underfill material being an uncured underfill material which is disposed between a semiconductor chip and a circuit substrate and which fixes the semiconductor chip to the circuit substrate when cured.

Patent Document 12 describes an adhesive film for underfill comprising a resin component containing an epoxy resin having a number average molecular weight of 600 or less, a phenol resin having a number average molecular weight of more than 500, and an elastomer, the resin component having specific contents of the epoxy resin and the phenol resin.

In addition, when the joint between a chip and a substrate is carried out via a metal that is easily oxidized, such as solder or copper, the flux component derived from a carboxylic acid or the like may be added to a pre-applied underfill material for the purpose of removing a oxidized layer, which is an inhibiting factor for the joint, and obtaining good metal joint.

CITATION LIST

Patent Document

Patent Document 1: Japanese Translation of PCT International Application Publication No. 2015-503220

Patent Document 2: Japanese Translation of PCT International Application Publication No. 2014-521754

Patent Document 3: Japanese Patent Application Laid-Open No. 2013-112730

Patent Document 4: Japanese Patent Application Laid-Open No. 2003-221443

Patent Document 5: Japanese Patent Application Laid-Open No. 2016-196548

Patent Document 6: Japanese Patent Application Laid-Open No. 2013-008800

Patent Document 7: Japanese Patent Application Laid-Open No. 2011-157529

Patent Document 8: Japanese Patent Application Laid-Open No. 2006-245242

Patent Document 9: Japanese Patent Application Laid-Open No. 2019-029599

Patent Document 10: Japanese Patent Application Laid-Open No. 2018-160566

Patent Document 11: Japanese Patent Application Laid-Open No. 2018-195823

Patent Document 12: Japanese Patent Application Laid-Open No. 2014-203964

SUMMARY OF INVENTION

Technical Problem

However, radical polymerizable monomers generally cures quickly, and the mobility of the adhesion site of the compounded silane coupling agent is rate-controlled by the main resin that has been polymerized before forming a sufficient number of bonds with the silanol groups on the surface of the chip. As a result, in the pre-applied underfill material described in Patent Document 1, a sufficient low-void property and good chip adhesiveness between the chip and substrates such as printed wiring boards and underfill materials cannot be obtained. In addition, since radical polymerizable monomers cures quickly, the resin composition cures before it is embedded in the unevenness present on the surface of the chip. Therefore, there is a problem that sufficient anchor effect, which is useful in improving adhesiveness, cannot be obtained by the pre-applied underfill material described in Patent Document 1.

Since the material described in Patent Document 2 acts only on the polyimide passivation film, there is a problem that the application range is narrow.

In the technique described in Patent Document 3, reaction between the carboxyl group containing compound and the epoxy compound progresses slightly even at room temperature, and the flux activity is reduced over time during storage. As a result, the pre-applied underfill material described in Patent Document 3 has problems such as low stability at the joint and poor mass productivity.

In the technique described in Patent Document 4, the water absorption rate of the maleimide resin is high, and thus proposing a problem that the chip adhesiveness after the moisture absorption treatment is significantly lowered. When the adhesiveness is insufficient, water penetrates from the peeling interface and the insulation reliability is greatly reduced. In addition, it is difficult even for the maleimide resin alone to achieve both a low-void property and chip adhesiveness.

In Patent Document 5, there is no description about the flux activity, and no description about the flux component, either. Therefore, the resin composition described in Patent Document 5 has a problem that good metal joint cannot be obtained.

In Patent Document 6, although the adhesiveness of the epoxy compound is high, the epoxy compound also reacts with the flux component, thus proposing a problem that flux activity sufficient for obtaining good metal joint cannot be obtained.

The adhesive composition of Patent Document 7 contains a thermosetting agent having a flux property, but in Examples, an epoxy compound and a polymer containing an epoxy group are used, and both react at a temperature lower than the bonding temperature. Therefore, it is difficult to obtain sufficient flux activity.

Patent Document 8 also describes that an epoxy resin is suitable as the thermosetting resin contained in the thermosetting resin composition, but as described above, the epoxy compound also reacts with the flux component, thus proposing a problem that flux activity sufficient for obtaining good metal joint cannot be obtained.

Further, in conventional underfill materials, there is a problem that good transmittivity cannot be obtained as described in, for example, Patent Document 9, paragraph [0002] and Patent Document 10, paragraph [0002]. In addition, in conventional underfill materials, there is a problem that it is necessary to control tackiness for securing handleability as described in, for example, Patent Document 11, paragraph [0016] and Patent Document 12, paragraph [0026].

The present invention has been made in view of such problems, and an object of the present invention is to provide a resin composition which are excellent in balance of a low-void property, and chip adhesiveness, tackiness, transmittivity and flux activity, a resin sheet, a laminate, a semiconductor wafer with a resin composition layer, a substrate for mounting a semiconductor with a resin composition layer, and a semiconductor device.

Solution to Problem

The present inventors have, as a result of devoted examinations to solve the above problems, found out that a resin composition containing a particular bismaleimide compound (A), a particular radical polymerizable resin or compound (B), and a curing accelerator (C) can solve the above problems, and reached the present invention.

More specifically, the present invention includes the following contents.

[1]

A resin composition comprising: a bismaleimide compound (A) containing a constituent unit represented by the following formula (1) and maleimide groups at both ends of the molecular chain; a radical polymerizable resin or compound (B) other than the bismaleimide compound (A); and a curing accelerator (C), wherein the radical polymerizable resin or compound (B) contains at least one selected from the group consisting of a citraconimide group, a vinyl group, a maleimide group, a (meth)acryloyl group and an allyl group.

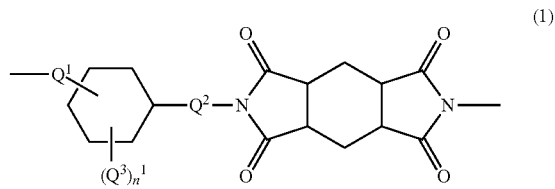

(In the formula (1), $Q^1$ represents a linear or branched alkylene group having 1 to 16 carbon atoms, or a linear or branched alkenylene group having 2 to 16 carbon atoms; $Q^2$ represents a linear or branched alkylene group having 1 to 16 carbon atoms, or a linear or branched alkenylene group having 2 to 16 carbon atoms; each $Q^3$ independently represents a hydrogen atom, a linear or branched alkyl group having 1 to 16 carbon atoms, or a linear or branched alkenyl group having 2 to 16 carbon atoms; and each $n^1$ independently represents an integer of 1 to 10.)

[2]

The resin composition according to [1], wherein the radical polymerizable resin or compound (B) contains a maleimide group.

[3]

The resin composition according to [1] or [2], wherein the radical polymerizable resin or compound (B) contains at least one selected from 2,2-bis[4-(4-maleimidophenoxy)phenyl}propane, a maleimide compound represented by the following formula (2), a maleimide compound represented by the following formula (3), a maleimide compound represented by the following formula (4), a maleimide compound represented by the following formula (5), a compound represented by the following formula (6), a compound represented by the following formula (7), a compound represented by the following formula (10), a compound represented by the following formula (11), a compound represented by the following formula (12), and a compound represented by the following formula (13).

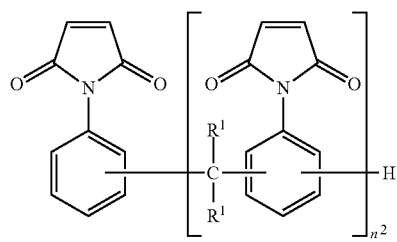

(2)

(In the formula (2), each $R^1$ independently represents a hydrogen atom or a methyl group, and $n^2$ represents an integer of 1 to 10.)

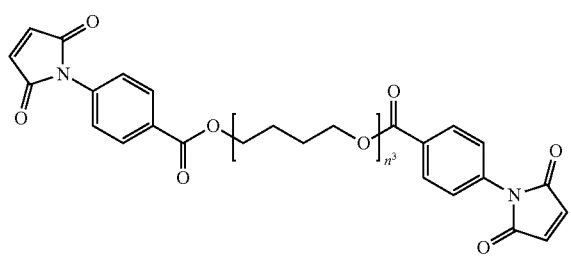

(3)

(In the formula (3), $n^3$ represents an integer of 1 to 30.)

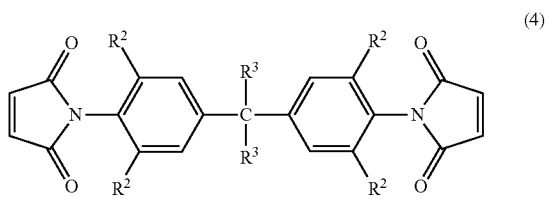

(4)

(In the formula (4), each $R^2$ independently represents a hydrogen atom, a methyl group, or an ethyl group; and each $R^3$ independently represents a hydrogen atom or a methyl group.)

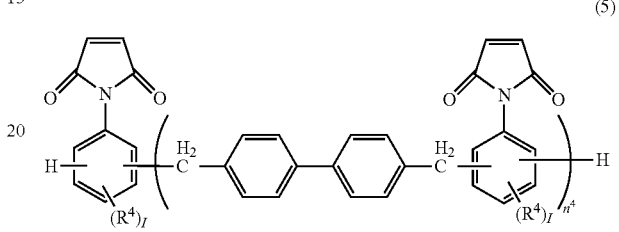

(5)

(In the formula (5), each $R^4$ independently represents a hydrogen atom, an alkyl group having 1 to 5 carbon atoms, or a phenyl group; each l independently represents an integer of 1 to 3; and $n^4$ represents an integer of 1 to 10.)

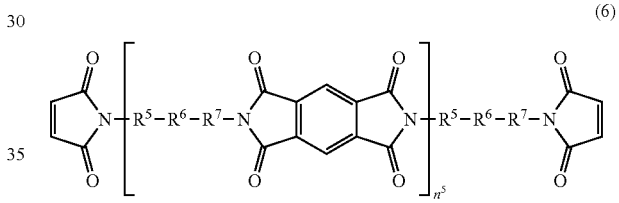

(6)

(In the formula (6), $R^5$ and $R^7$ each independently represent a hydrocarbon group in which 8 or more atoms are linearly linked; each $R^6$ independently represents a substituted or unsubstituted cyclic hydrocarbon group optionally having a heteroatom in which 4 to 10 atoms constitute the ring; and $n^5$ represents an integer of 1 to 10.)

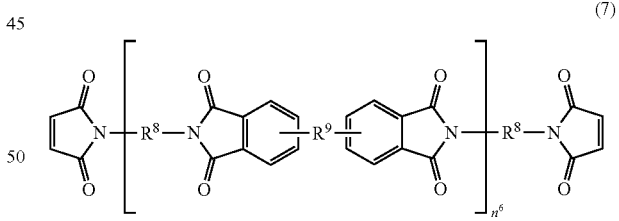

(7)

(In the formula (7), each $R^8$ independently represents an alkylene group; each $R^9$ independently represents an alkylene group, a group represented by the following formula (8), a group represented by the formula "—$SO_2$—", a group represented by the formula "—CO—", a group represented by the following formula (9), an oxygen atom, or a single bond; and $n^6$ represents an integer of 1 to 10.)

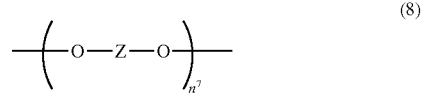

(8)

(In the formula (8), Z is an alkylene group or a hydrocarbon group having 6 to 30 carbon atoms and having an aromatic ring; and $n^7$ represents an integer of 0 to 5.)

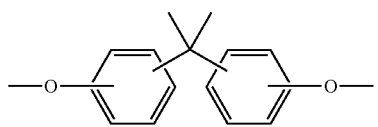
(9)

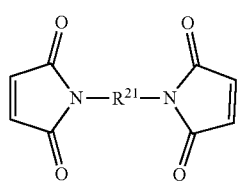
(10)

(In the formula (10), $R^{21}$ represents at least one selected from a linear or branched alkylene group having 1 to 40 carbon atoms, a cyclic hydrocarbon group optionally having a heteroatom in which 3 to 20 atoms constitute the ring, an oxygen atom, a group represented by "—NH—", a sulfur atom, and a group represented by the formula "—$SO_2$—".)

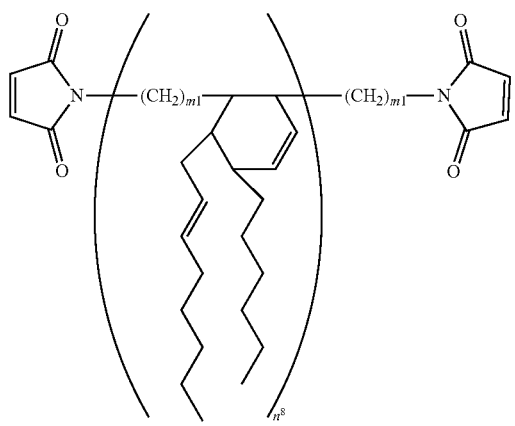
(11)

(In the formula (11), $n^8$ represents an integer of 1 to 10; and m1 represents an integer of 8 to 40.)

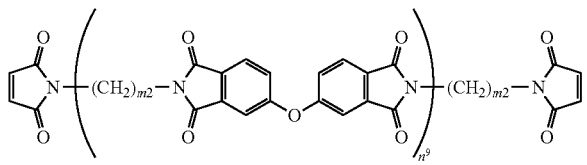
(12)

(In the formula (12), $n^9$ represents an integer of 1 to 10; and m2 represents an integer of 8 to 40.)

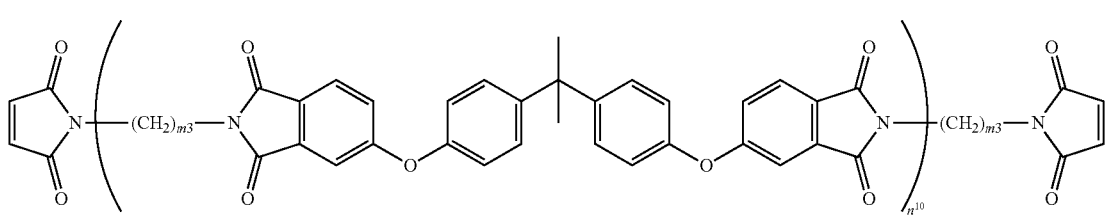
(13)

(In the formula (13), $n^{10}$ represents an integer of 1 to 10; and m3 represents an integer of 8 to 40.)

[4]
The resin composition according to any one of [1] to [3], wherein the curing accelerator (C) contains at least one selected from the group consisting of a thermal radical polymerization initiator (D) and an imidazole compound (E).

[5]
The resin composition according to [4], wherein the thermal radical polymerization initiator (D) has a 10 hour half-life period temperature of 100° C. or higher.

[6]
The resin composition according to [4] or [5], wherein the radical polymerization initiator (D) contains an organic peroxide.

[7]
The resin composition according to any of [4] to [6], wherein the thermal radical polymerization initiator (D) has a peroxy ester, a peroxy ketal, a dialkyl peroxide, or a hydroperoxide skeleton.

[8]
The resin composition according to any of [4] to [7], wherein the thermal radical polymerization initiator (D) contains at least one selected from dicumyl peroxide, di(2-tert-butylperoxyisopropyl)benzene, 1,1,3,3-tetramethylbutyl hydroperoxide, 2,5-dimethyl-2,5-bis(tert-butylperoxy)hexyne-3, and tert-butyl hydroperoxide.

[9]
The resin composition according to any of [1] to [8], wherein a content of the bismaleimide compound (A) is 1 part by mass to 99 parts by mass based on 100 parts by mass in total of the bismaleimide compound (A) and the radical polymerizable resin or compound (B).

[10]
The resin composition according to any of [1] to [9], wherein a content of the curing accelerator (C) is 0.05 parts by mass to 10 parts by mass based on 100 parts by mass in total of the bismaleimide compound (A) and the radical polymerizable resin or compound (B).

[11]
The resin composition according to any of [1] to [10], further comprising a thermosetting compound (F) other than the bismaleimide compound (A) and the radical polymerizable resin or compound (B).

[12]
The resin composition according to [11], wherein the thermosetting compound (F) has a molecular weight of 400 or more.

[13]
The resin composition according to [11] or [12], wherein the thermosetting compound (F) contains a benzoxazine compound.

[14]

The resin composition according to [13], wherein the benzoxazine compound contains at least one selected from a compound represented by the following formula (14), a compound represented by the following formula (15), a compound represented by the following formula (16) and a compound represented by the following formula (17).

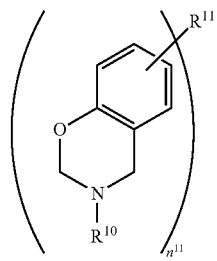
(14)

(In the formula (14), $R^{10}$ represents an aryl group, an aralkyl group, an alkenyl group, an alkyl group, or a cycloalkyl group; $R^{11}$ represents a hydrogen atom, an aryl group, an aralkyl group, an alkenyl group, an alkyl group, a cycloalkyl group, or a monovalent to tetravalent organic group represented by the following general formulas (a) to (t); and $n_{11}$ represents an integer of 1 to 4.)

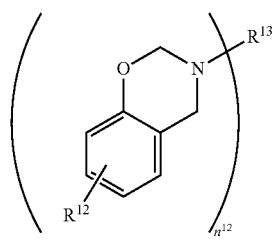
(15)

(In the formula (15), $R^{12}$ represents a hydrogen atom, an aryl group, an aralkyl group, an alkenyl group, an alkyl group, or a cycloalkyl group; $R^{13}$ represents an aryl group, an aralkyl group, an alkenyl group, an alkyl group, a cycloalkyl group, or a monovalent to tetravalent organic group represented by the following general formulas (a) to (t); and $n^{12}$ represents an integer of 1 to 4.)

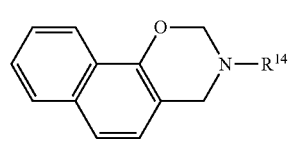
(16)

(In the formula (16), $R^{14}$ represents an alkyl group, a cycloalkyl group, or a phenyl group optionally having a substituent.)

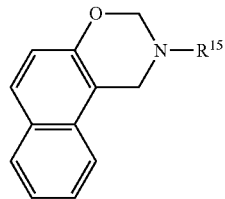
(17)

(In the formula (17), $R^{15}$ represents an alkyl group, a cycloalkyl group, or a phenyl group optionally having a substituent.)

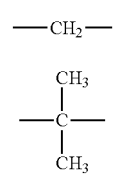
(a)

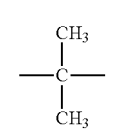
(b)

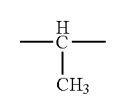
(c)

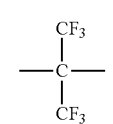
(d)

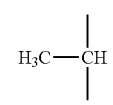
(e)

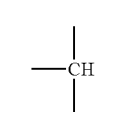
(f)

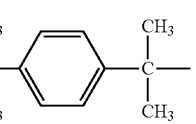
(g)

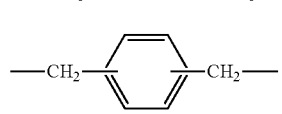
(h)

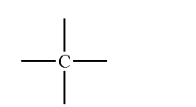
(i)

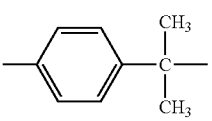
(j)

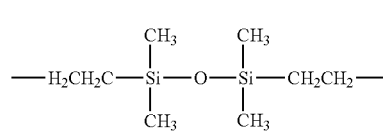
(k)

-continued

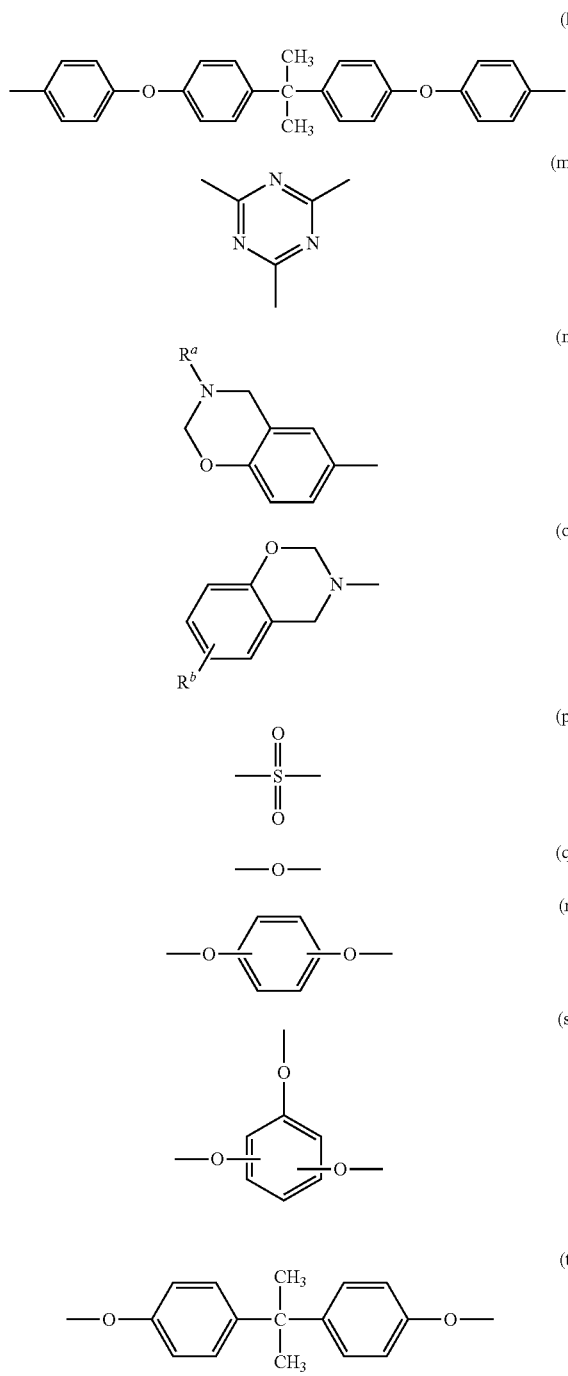

(In the formulas (a) to (t), $R^a$ represents an aryl group, an aralkyl group, an alkenyl group, an alkyl group, or a cycloalkyl group; and $R^b$ represents a hydrogen atom, an aryl group, an aralkyl group, an alkenyl group, an alkyl group, or a cycloalkyl group.)

[15]

The resin composition according to [13] or [14], wherein the benzoxazine compound contains at least one selected from a compound represented by the following formula (18), a compound represented by the following formula (19), and a compound represented by the following formula (20).

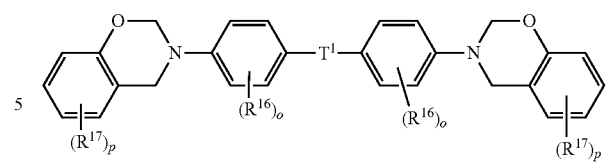

(In the formula (18), each $R^{16}$ independently represents a hydrogen atom, an aryl group, an aralkyl group, an alkenyl group, an alkyl group, or a cycloalkyl group; each o independently represents an integer of 1 to 4; each $R^{17}$ independently represents a hydrogen atom, an aryl group, an aralkyl group, an allyl group, an alkyl group, or a cycloalkyl group; each p independently represents an integer of 1 to 4; and $T^1$ represents an alkylene group, a group represented by the following formula (8), a group represented by the formula "—SO$_2$—", a group represented by the formula "—CO—", an oxygen atom, or a single bond.)

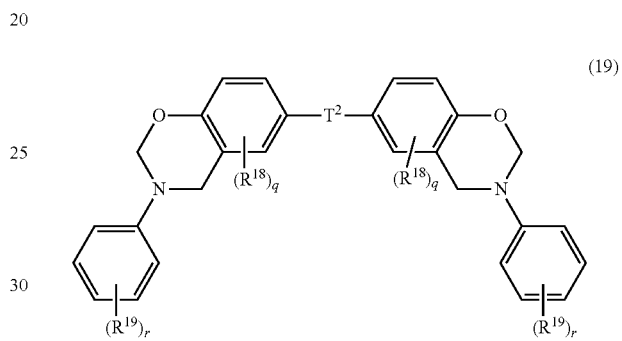

(In the formula (19), each $R^{18}$ independently represents a hydrogen atom, an aryl group, an aralkyl group, an alkenyl group, an alkyl group, or a cycloalkyl group; each q independently represents an integer of 1 to 3; each $R^{19}$ independently represents a hydrogen atom, an aryl group, an aralkyl group, an alkenyl group, an alkyl group, or a cycloalkyl group; each r independently represents an integer of 1 to 5; and $T^2$ represents an alkylene group, a group represented by the following formula (8), a group represented by the formula "—SO$_2$—", a group represented by the formula "—CO—", an oxygen atom, or a single bond.)

(8)

(In the formula (8), Z is an alkylene group or a hydrocarbon group having 6 to 30 carbon atoms and having an aromatic ring; and $n^7$ represents an integer of 0 to 5.)

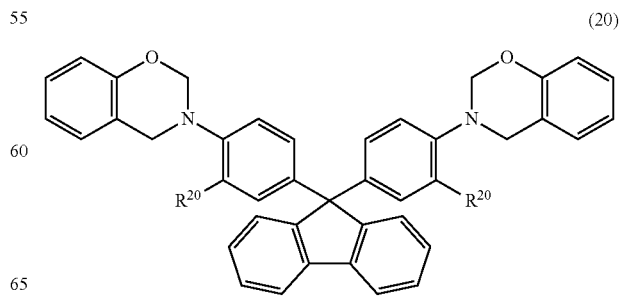

(20)

(In the formula (20), each $R^{20}$ independently represents a hydrogen atom or a hydrocarbon group having 1 to 4 carbon atoms.)

[16]

The resin composition according to [15], wherein the compound represented by the formula (18) contains a compound represented by the following formula (21) and/or a compound represented by the following formula (22), and the compound represented by the formula (19) contains at least one selected from a compound represented by the following formula (23), a compound represented by the following formula (24), and a compound represented by the following formula (25).

(21)

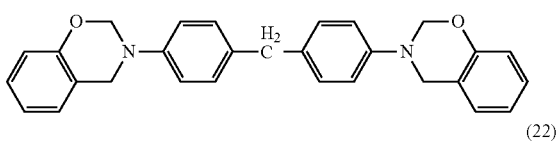

(22)

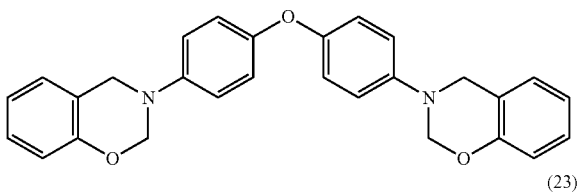

(23)

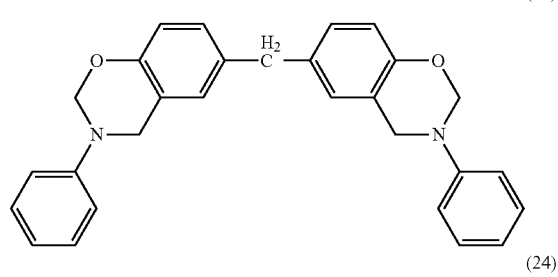

(24)

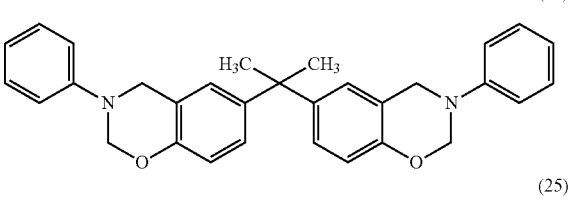

(25)

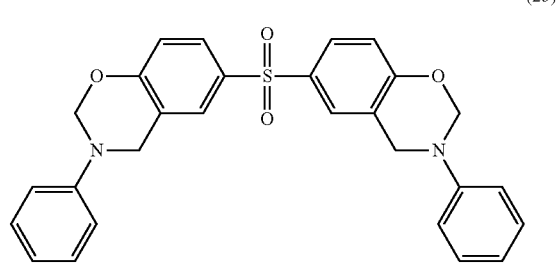

[17]

The resin composition according to any of [11] to [16], wherein a content of the thermosetting compound (F) is 1 part by mass to 99 parts by mass based on 100 parts by mass in total of the bismaleimide compound (A) and the radical polymerizable resin or compound (B).

[18]

The resin composition according to any of [1] to [17], further comprising an inorganic filler (G).

[19]

The resin composition according to [18], wherein the inorganic filler (G) has an average particle diameter of 3 μm or less.

[20]

The resin composition according to [18] or [19], wherein the inorganic filler (G) contains at least one selected from silica, aluminum hydroxide, alumina, boehmite, boron nitride, aluminum nitride, magnesium oxide, and magnesium hydroxide.

[21]

The resin composition according to any of [18] to [20], wherein the inorganic filler (G) is silica.

[22]

The resin composition according to any of [16] to [19], wherein a content of the inorganic filler (G) is 500 parts by mass or less based on 100 parts by mass in total of the bismaleimide compound (A) and the radical polymerizable resin or compound (B).

[23]

The resin composition according to any of [1] to [22], further comprising an organic compound (H) having a flux function.

[24]

The resin composition according to [23], wherein a content of the organic compound (H) having the flux function is 1 part by mass to 60 parts by mass based on 100 parts by mass in total of the bismaleimide compound (A) and the radical polymerizable resin or compound (B).

[25]

The resin composition according to any of [1] to [24], for use in a underfill materials.

[26]

The resin composition according to any of [1] to [25], for use in a pre-applied underfill material.

[27]

A resin sheet comprising the resin composition according to any of [1] to [26].

[28]

A laminate comprising: a supporting material; and a layer containing the resin composition according to any of [1] to [26] laminated on the supporting material.

[29]

A semiconductor wafer with a resin composition layer, comprising: a semiconductor wafer; and the laminate according to [28] laminated on the semiconductor wafer, wherein the layer containing the resin composition is laminated on the semiconductor wafer.

[30]

A substrate for mounting a semiconductor with a resin composition layer, comprising: a substrate for mounting the semiconductor; and the laminate according to [28] laminated on the substrate for mounting the semiconductor, wherein the layer containing the resin composition is laminated on the substrate for mounting the semiconductor.

[31]

A semiconductor device, comprising the semiconductor wafer with a resin composition layer according to [29]; and/or the substrate for mounting the semiconductor with a resin composition layer according to [30].

Advantageous Effects of Invention

According to the present invention, it is possible to obtain a resin composition which are excellent in balance of a low-void property, and chip adhesiveness, tackiness, transmittivity and flux activity, a resin sheet, a laminate, a semiconductor wafer with a resin composition layer, a substrate for mounting a semiconductor with a resin composition layer, and a semiconductor device.

DESCRIPTION OF EMBODIMENT

An embodiment for carrying out the present invention (which will be simply referred to as the "present embodiment" hereinafter) will now be described. Note that the present embodiment below is given in order to illustrate the present invention, and the present invention is not limited only to the present embodiment.

According to one aspect of the present embodiment, a resin composition contains a particular bismaleimide compound (A), a particular radical polymerizable resin or compound (B), and a curing accelerator (C). From the viewpoint of achieving action effects according to the present invention more effectively and reliably, the resin composition is preferably for underfill materials and is more preferably for pre-applied underfill materials.

Another aspect of the present embodiment is a resin composition further containing a thermosetting compound (F).

Another aspect of the present embodiment is a resin composition further containing an inorganic filler (G).

Another aspect of the present embodiment is a resin composition further containing an organic compound (H) having a flux function.

Note that, in the present embodiment, "(meth)acryloyl" refers to both "acryloyl" and "methacryloyl" corresponding thereto, "(meth)acryl" refers to both "acryl" and "methacryl" corresponding thereto, "(meth)acrylate" refers to both "acrylate" and "methacrylate" corresponding thereto, and "(meth)allyl" refers to both "allyl" and "methallyl" corresponding thereto.

Resin Composition

The resin composition of the present embodiment contains a bismaleimide compound (A) containing a constituent unit represented by the formula (1) and maleimide groups at both ends of the molecular chain, a radical polymerizable resin or compound (B) other than the bismaleimide compound (A), and a curing accelerator (C), and the radical polymerizable resin or compound (B) contains at least one selected from the group consisting of a citraconimide group, a vinyl group, a maleimide group, a (meth)acryloyl group and an allyl group. The resin composition of the present embodiment is suitable for underfill materials used for flip chip bonding of the chip, and more suitable for pre-applied underfill materials used for flip chip bonding of the chip.

The resin composition of the present embodiment may contain at least any one of a thermosetting compound (F), an inorganic filler (G), and an organic compound (H) having a flux function.

It is not clear why a resin composition excellent in balance of a low-void property, and chip adhesiveness, tackiness, transmittivity and flux activity is obtained in the present embodiment, but the present inventors presume the reason as follows. The bismaleimide compound (A) represented by the formula (1) has a flexible skeleton, has a low viscosity, and has a maleimide group which is radically polymerized sufficiently together with the later-described radical polymerizable resin or compound (B) and the later-described curing accelerator (C). As a result, radical polymerization can be suitably performed, and a flexible structure can be formed with the radical polymerizable resin or compound (B) even after the polymerization. In addition, the bismaleimide compound (A) has many aliphatic skeletons, and therefore has excellent light transmittivity. In addition, when the resin composition has a low viscosity, for example, application of the resin composition to an underfill material improves the mobility of polar functional groups which contribute to adhesiveness between chips, and the substrate and the underfill material, so that the underfill material easily follows asperities present on the surfaces of the chip, leading to improvement of the embedding property of the underfill material. As a result, good chemical bonds are generated between polar functional groups contained in the underfill material and silanol groups in the chip, so that the resin composition has a low-void property and low tackiness, and sufficient chip adhesiveness can be obtained due to an anchor effect by embedment of the underfill material in the asperities on the chip. In addition, it is also presumed that the maleimide compound very hardly reacts with the flux component during storage or due to heat treatment compared to epoxy compounds, thereby not causing deactivation of the flux. Further, it is presumed that by using the bismaleimide compound (A) represented by the formula (1), good transmittivity can be obtained even in polymerization with the radical polymerizable resin or compound (B).

Bismaleimide Compound (A)

The resin composition of the present embodiment contains the bismaleimide compound (A) (also referred to as component (A)) according to the present embodiment which contains a constituent unit represented by the formula (1) and maleimide groups at both ends of the molecular chain.

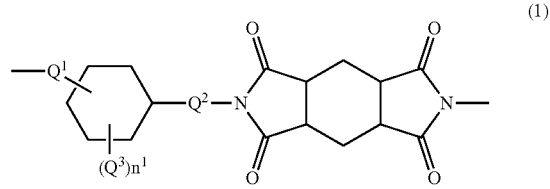

(1)

In the formula (1), $Q^1$ represents a linear or branched alkylene group having 1 to 16 carbon atoms, or a linear or branched alkenylene group having 2 to 16 carbon atoms. $Q^2$ represents a linear or branched alkylene group having 1 to 16 carbon atoms, or a linear or branched alkenylene group having 2 to 16 carbon atoms. Each $Q^3$ independently represents a hydrogen atom, a linear or branched alkyl group having 1 to 16 carbon atoms, or a linear or branched alkenyl group having 2 to 16 carbon atoms. Each $n^1$ independently represents an integer of 1 to 10.

The bismaleimide compound (A) according to the present embodiment contains a constituent unit represented by the formula (1), and therefore has very excellent transmittivity and flux activity. In addition, since a maleimide group having radical polymerization reactivity is present at an end, a reaction of a maleimide group with polymerizable functional groups in the later-described radical polymerizable resin or compound (B), i.e. a citraconimide group, a vinyl group, a maleimide group, a (meth)acryloyl group and an allyl group easily proceeds. As a result, the crosslinking density of the resulting cured product is increased, but since the main skeleton is a flexible skeleton, excellent tackiness is obtained, and heat resistance (glass transition temperature) is improved. The resin composition of the present embodiment contains the bismaleimide compound (A) according to the present embodiment together with the later-described radical polymerizable resin or compound (B) and the later-described curing accelerator (C), and thus has a low-void property and excellent chip adhesiveness as described above.

As described above, the resin composition of the present embodiment is excellent in balance of a low-void property, chip adhesiveness, tackiness, transmittivity and flux activity, is thus suitable for underfill materials, and can be more suitably used for pre-applied underfill materials. In addition, for example, in a resin having an epoxy group, a polar group having water absorbency is generated after the reaction, but the bismaleimide compound (A) according to the present embodiment does not generate a polar group having water absorbency. As a result, a cured product having low water (moisture) absorbency and high insulation reliability can be obtained.

The mass average molecular weight of the bismaleimide compound (A) is not particularly limited as long as the effect of the present invention is exhibited, and the mass average molecular weight is preferably 100 to 5000, and more preferably 300 to 4500 because a suitable viscosity can be obtained and an increase in viscosity of varnish can be suppressed. Note that, in the present embodiment, the term "mass average molecular weight" means a mass average molecular weight in terms of polystyrene standard by a gel permeation chromatography (GPC) method.

The structure of the bismaleimide compound (A) will now be described.

In the formula (1) of the bismaleimide compound (A), $Q^1$ represents a linear or branched alkylene group having 1 to 16 carbon atoms, or a linear or branched alkenylene group having 2 to 16 carbon atoms. $Q^1$ is preferably a linear or branched alkylene group, and more preferably a linear alkylene group because a suitable viscosity can be obtained and an increase in viscosity of varnish can be controlled.

The number of carbon atoms in the alkylene group is preferably 2 to 14, and more preferably 4 to 12 because a more suitable viscosity can be obtained and an increase in viscosity of varnish can be more reliably controlled.

Examples of the linear or branched alkylene group include a methylene group, an ethylene group, a propylene group, a 2,2-dimethylpropylene group, a butylene group, a pentylene group, a hexylene group, a heptylene group, an octylene group, a nonylene group, a decylene group, a dodecylene group, an undecylene group, a tridecylene group, a tetradecylene group, a pentadecylene group, a hexadecylene group, an octadecylene group, a neopentylene group, a dimethylbutylene group, a methylhexylene group, an ethylhexylene group, a dimethylhexylene group, a trimethylhexylene group, a methylheptylene group, a dimethylheptylene group, a trimethylheptylene group, a tetramethylheptylene group, an ethylheptylene group, a methyloctylene group, a methylnonylene group, a methyldecylene group, a methyldodecylene group, a methylundecylene group, a methyltridecylene group, a methyltetradecylene group, a methylpentadecylene group and a methylhexadecylene group.

The number of carbon atoms in the alkenylene group is preferably 2 to 14, and more preferably 4 to 12 because a more suitable viscosity can be obtained and an increase in viscosity of varnish can be more reliably controlled.

Examples of the linear or branched alkenylene group include a vinylene group, a 1-methylvinylene group, an arylene group, a propenylene group, an isopropenylene group, a 1-butenylene group, a 2-butenylene group, a 1-pentenylene group, a 2-pentenylene group, an isopentylene group, a cyclopentenylene group, a cyclohexenylene group and a dicyclopentadienylene group.

In the formula (1), $Q^2$ represents a linear or branched alkylene group having 1 to 16 carbon atoms, or a linear or branched alkenylene group having 2 to 16 carbon atoms. $Q^2$ is preferably a linear or branched alkylene group, and more preferably a linear alkylene group because a suitable viscosity can be obtained and an increase in viscosity of varnish can be controlled.

The number of carbon atoms in the alkylene group is preferably 2 to 14, and more preferably 4 to 12 because a more suitable viscosity can be obtained and an increase in viscosity of varnish can be more reliably controlled.

For the linear or branched alkylene group, $Q^2$ can be referred to.

The number of carbon atoms in the alkenylene group is preferably 2 to 14, and more preferably 4 to 12 because a more suitable viscosity can be obtained and an increase in viscosity of varnish can be more reliably controlled.

For the linear or branched alkenylene group, $Q^2$ can be referred to.

In the formula (1), $Q^1$ and $Q^2$ may be the same or different, and are preferably the same because the bismaleimide compound (A) can be more easily synthesized.

In the formula (1), each $Q^3$ independently represents a hydrogen atom, a linear or branched alkyl group having 1 to 16 carbon atoms, or a linear or branched alkenyl group having 2 to 16 carbon atoms. It is preferable that each $Q^3$ be independently a hydrogen atom or a linear or branched alkyl group having 1 to 16 carbon atoms because a suitable viscosity can be obtained and an increase in viscosity of varnish can be controlled, it is more preferable that one to five groups ($Q^3$s) among $Q^3$s be linear or branched alkyl groups each having 1 to 16 carbon atoms, and other groups ($Q^3$) be hydrogen atoms, and it is still more preferable that one to three groups ($Q^3$s) among $Q^3$s be linear or branched alkyl groups each having 1 to 16 carbon atoms, and other groups ($Q^3$) be hydrogen atoms.

The number of carbon atoms in the alkyl group is preferably 2 to 14, and more preferably 4 to 12 because a more suitable viscosity can be obtained and an increase in viscosity of varnish can be more reliably controlled.

Examples of the linear or branched alkyl group include a methyl group, an ethyl group, a n-propyl group, an isopropyl group, a n-butyl group, a 2-butyl group, an isobutyl group, a tert-butyl group, a n-pentyl group, a 2-pentyl group, a tert-pentyl group, a 2-methylbutyl group, a 3-methylbutyl group, a 2,2-dimethylpropyl group, a n-hexyl group, a 2-hexyl group, a 3-hexyl group, a 2-methylpentyl group, a 3-methylpentyl group, a 4-methylpentyl group and a 2-methylpentan-3-yl group.

The number of carbon atoms in the alkenyl group is preferably 2 to 14, and more preferably 4 to 12 because a more suitable viscosity can be obtained and an increase in viscosity of varnish can be more reliably controlled.

Examples of the linear or branched alkenyl group include a vinyl group, an allyl group, a 4-pentenyl group, an isopropenyl group and an isopentyl group.

In the formula (1), each $n^1$ independently represents an integer of 1 to 10.

The bismaleimide compound (A) has maleimide groups at both ends of the molecular chain. In the present embodiment, the term "both ends" means both ends of the molecular chain of the bismaleimide compound (A), and for example, when the structural unit represented by the formula (1) is present at an end of the molecular chain of the bismaleimide compound (A), the maleimide group is present at an end of the molecular chain of $Q^1$, at an end of the molecular chain on the N atom of the maleimide ring, or at each of both the ends. The bismaleimide compound (A) may have maleimide groups at positions other than both ends of the molecular chain.

In the present embodiment, the maleimide group is represented by the formula (26), and the N atom is bonded to the molecular chain of the bismaleimide compound (A). In addition, the maleimide groups bonded to the bismaleimide compound (A) may be all the same or different, and the maleimide groups at both ends of the molecular chain are preferably the same.

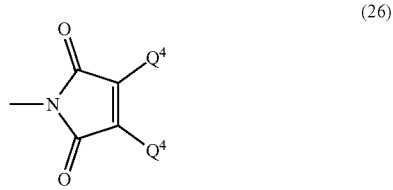

(26)

In the formula (26), each $Q^4$ independently represents a hydrogen atom, or a linear or branched alkyl group having 1 to 4 carbon atoms. Each $Q^4$ is preferably a hydrogen atom because curing is suitably performed.

The number of carbon atoms in the alkyl group is preferably 1 to 3, and more preferably 1 or 2 because curing is suitably performed.

For the linear or branched alkyl group, $Q^3$ can be referred to.

Examples of such a bismaleimide compound (A) include a maleimide compound represented by the formula (27).

resented by the formula (27), which is a mixture where a in the formula (27) is 1 to 6 (integer)) manufactured by Nippon Kayaku Co., Ltd.

In the resin composition of the present embodiment, the content of the bismaleimide compound (A) is not particularly limited, and is preferably 1 part by mass to 99 parts by mass, more preferably 3 parts by mass to 95 parts by mass, still more preferably 5 parts by mass to 90 parts by mass, and furthermore preferably 10 parts by mass to 85 parts by mass, furthermore preferably 15 parts by mass to 80 parts by mass based on 100 parts by mass of the total of the bismaleimide compound (A) and the later-described radical polymerizable resin or compound (B), from the viewpoint that it becomes possible to obtain a cured product mainly composed of the bismaleimide compounds, curability is further improved, and further a low-void property can be obtained.

One of these bismaleimide compounds (A) can be used, or two or more thereof can be appropriately mixed and used.

Method for Producing Bismaleimide Compound (A)

The bismaleimide compound (A) according to the present embodiment can be produced by a known method. For example, 1,2,4,5-cyclohexanetetracarboxylic dianhydride, a monomer containing a diamine including a dimer diamine or the like, and a maleimide compound are subjected to a polyaddition reaction at a temperature of normally 80° C. to 250° C., preferably 100° C. to 200° C. for normally 0.5 hours to 50 hours, preferably 1 hour to 20 hours to obtain a polyaddition product, and the polyaddition product is then subjected to an imidization reaction, i.e. a ring closure reaction with dehydration at a temperature of normally 60° C. to 120° C., preferably 80° C. to 100° C. for normally 0.1

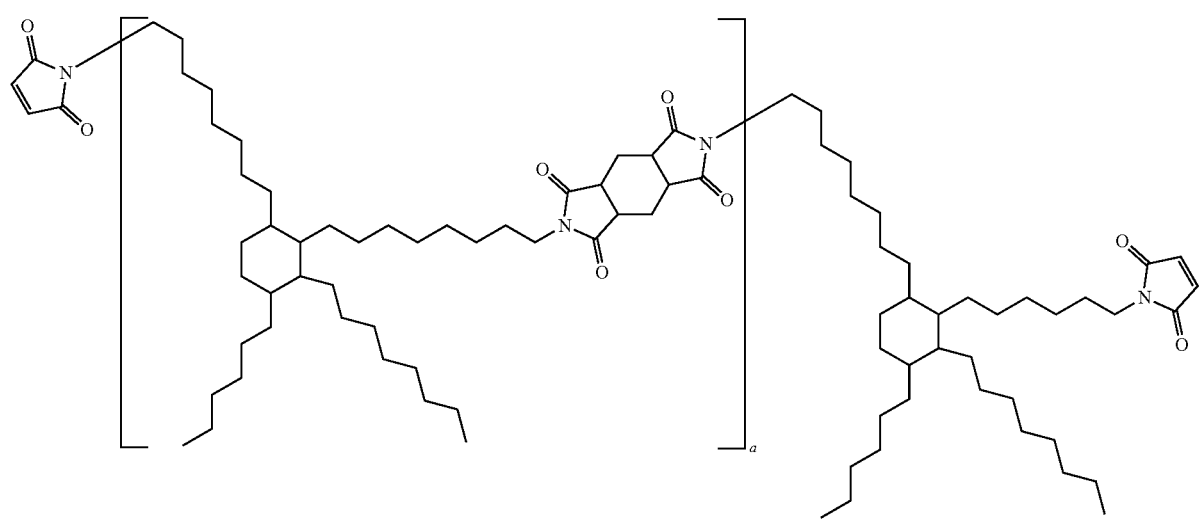

(27)

In the formula (27), a represents an integer of 1 to 10. a is preferably an integer of 1 to 6 because a more suitable viscosity can be obtained and an increase in viscosity of varnish can be more reliably controlled.

As the bismaleimide compound (A), commercial products can also be used. Examples of the commercial product include MIZ-001 (trade name, a maleimide compound rephours to 2 hours, preferably 0.1 hours to 0.5 hours to obtain the bismaleimide compound (A).

The dimer diamine can be obtained by, for example, a reductive amination reaction of a dimer acid, and the amination reaction can be conducted by, for example, a known method such as a reduction method using ammonia and a catalyst (e.g. the method described in Japanese Patent Laid-Open No. 9-12712). The dimer acid is a dibasic acid obtained by dimerization of an unsaturated fatty acid through an intermolecular polymerization reaction or the like. Depending on synthesis conditions and purification conditions, a small amount of monomer acids, trimer acids or the like are normally contained in addition to the dimer acid. After the reaction, double bonds remain in the obtained molecule, and in the present embodiment, the dimer acids also include those formed into saturated dibasic acids by reduction of double bonds present in the molecule through a hydrogenation reaction. The dimer acid can be obtained by, for example, polymerizing an unsaturated fatty acid using Lewis acid and Broensted acid as catalysts. The dimer acid can be produced by a known method (e.g. the method described in Japanese Patent Laid-Open No. 9-12712). Examples of the unsaturated fatty acid include crotonic acid, myristoleic acid, palmitoleic acid, oleic acid, elaidic acid, vaccenic acid, gadoleic acid, eicosenoic acid, erucic acid, nervonic acid, linoleic acid, pinolenic acid, eleostearic acid, mead acid, dihomo-γ-linolenic acid, eicosatrienoic acid, stearidonic acid, arachidonic acid, eicosatetraenoic acid, adrenic acid, bosseopentaenoic acid, Osbond acid, clupanodonic acid, tetracosapentaenoic acid, docosahexaenoic acid and Nisinic acid. The number of carbon atoms in the unsaturated fatty acid is normally 4 to 24, and preferably 14 to 20.

In production of the bismaleimide compound (A), it is preferable that the monomer containing a diamine be dissolved or dispersed in a slurry form in an organic solvent in an inert atmosphere of, for example, argon, nitrogen or the like to form a monomer solution containing a diamine in advance. It is preferable that the 1,2,4,5-cyclohexanetetracarboxylic dianhydride be added to the monomer solution containing a diamine after being dissolved or dispersed in a slurry form in an organic solvent, or in a solid state.

A desired bismaleimide compound (A) can be obtained by adjusting the number of moles of the 1,2,4,5-cyclohexanetetracarboxylic dianhydride and the number of moles of the total amount of the monomer containing a diamine and the maleimide compound.

Various known solvents can be used for the polyaddition reaction and the imidization reaction. The solvent is not particularly limited, and examples thereof include amides such as N,N-dimethylformamide, N,N-dimethylacetamide and N-methyl-2-pyrrolidone; ketones such as acetone, methyl ethyl ketone, methyl isobutyl ketone, cyclohexanone and isophorone; esters such as γ-butyrolactone, γ-valerolactone, δ-valerolactone, γ-caprolactone, ε-caprolactone, α-methyl-γ-butyrolactone, ethyl lactate, methyl acetate, ethyl acetate and butyl acetate; aliphatic alcohols having 1 to 10 carbon atoms such as methanol, ethanol and propanol; aromatic group-containing phenols such as phenol and cresol; aromatic group-containing alcohols such as benzyl alcohol; glycols such as ethylene glycol and propylene glycol, monoethers or diethers of these glycols and methanol, ethanol, butanol, hexanol, octanol, benzyl alcohol, phenol, cresol and the like, or glycol ethers such as esters of these monoethers; cyclic ethers such as dioxane and tetrahydrofuran; cyclic carbonates such as ethylene carbonate and propylene carbonate; aliphatic hydrocarbons and aromatic hydrocarbons such as toluene and xylene; and aprotic polar solvents such as dimethylsulfoxide. One of these solvents can be used alone, or two or more thereof can be combined and used as necessary.

It is preferable to use a catalyst in the imidization reaction. The catalyst is not particularly limited, and for example, tertiary amines and dehydration catalysts can be used. The tertiary amine is preferably a heterocyclic tertiary amine, and examples thereof include pyridine, picoline, quinoline and isoquinoline. The dehydration catalyst is not particularly limited, and examples thereof include acetic anhydride, propionic anhydride, n-butyric anhydride, benzoic anhydride and trifluoroacetic anhydride.

The amount of the catalyst added is not particularly limited, and it is preferable that for example, the amount of an imidizing agent be 0.5 times to 5.0 times the amount of amide groups on a molar basis, and the amount of the dehydration catalyst be 0.5 times to 10.0 times the amount of amide groups on a molar basis.

After completion of the imidization reaction, the solution may be used as a bismaleimide compound (A) solution, or a poor solvent may be added to the reaction solvent to form the bismaleimide compound (A) into a solid matter. The poor solvent is not particularly limited, but examples thereof include water, methyl alcohol, ethyl alcohol, 2-propyl alcohol, ethylene glycol, triethylene glycol, 2-butyl alcohol, 2-pentyl alcohol, 2-hexyl alcohol, cyclopentyl alcohol, cyclohexyl alcohol, phenol and t-butyl alcohol.

Radical Polymerizable Resin or Compound (B)

The resin composition of the present embodiment contains the radical polymerizable resin or compound (B) (also referred to as the "component (B)") other than the bismaleimide compound (A) according to the present embodiment. The radical polymerizable resin or compound (B) according to the present embodiment contains at least one selected from a citraconimide group, a vinyl group, a maleimide group, a (meth)acryloyl group and an allyl group. The radical polymerizable resin or compound (B) according to the present embodiment is not particularly limited as long as it exhibits reactivity with the bismaleimide compound (A) according to the present embodiment together with the later-described curing accelerator. Preferably, the radical polymerizable resin or compound (B) does not have reactivity with the later-described organic compound (H) having the flux function. One of these radical polymerizable resins or compounds (B) can be used, or two or more thereof can be mixed and used.

The radical polymerizable resin or compound (B) having a citraconimide group as a polymerizable functional group is not particularly limited as long as it has one or more citraconimide groups in the molecule and is a resin or compound other than the bismaleimide compound (A) according to the present embodiment. Examples thereof include o-phenylenebiscitraconimide, m-phenylenebiscitraconimide, p-phenylenebiscitraconimide, 4,4-diphenylmethanebiscitraconimide, 2,2-bis[4-(4-citraconimidophenoxy)phenyl]propane, bis(3,5-dimethyl-4-citraconimidophenyl)methane, bis(3-ethyl-5-methyl-4-citraconimidophenyl)methane, bis(3,5-diethyl-4-citraconimidophenyl)methane, 1,3-xylylenebis(citraconimide), N-[3-bis(trimethylsilyl)amino-1-propyl]citraconimide, N-[3-bis(triethylsilyl)amino-1-propyl]citraconimide, N-[3-bis(triphenylsilyl)amino-1-propyl]citraconimide, N,N'-(m-phenylenedimethylene)dicitraconimide, and N-[3-(methylidenesuccinimidomethyl)benzyl]citraconimide. One of the resins or compounds (B) having a citraconimide group can be used, or two or more thereof can be mixed and used.

The radical polymerizable resin or compound (B) having a vinyl group as a polymerizable functional group is not particularly limited as long as it has one or more vinyl groups in the molecule and is a resin or compound other than the bismaleimide compound (A) according to the present embodiment. Examples thereof include vinyl ethers such as ethyl vinyl ether, propyl vinyl ether, hydroxyethyl vinyl ether, ethylene glycol divinyl ether; and difunctional phenylene ether oligomers having a vinyl group. One of the resins or compounds (B) having a vinyl group can be used, or two or more thereof can be mixed and used.

It is more preferable that the radical polymerizable resin or compound (B) according to the present embodiment contain a maleimide group in the molecule from the viewpoint of having more sufficient a low-void property, chip adhesiveness and tackiness and having good insulation reliability and heat resistance because excellent reactivity with the bismaleimide compound (A) according to the present embodiment can be obtained.

It is not clear why the radical polymerizable resin or compound (B) containing a maleimide group is preferable, but the present inventors presume the reason as follows. That is, the addition reaction of the radical polymerizable resin or compound (B) containing a maleimide group and the bismaleimide compound (A) shows higher reactivity over the polymerization reaction of bismaleimide compounds (A). As this addition reaction proceeds, the maleimide group of the bismaleimide compound (A) loses a part of the function of polymerizing with other bismaleimide compounds (A). In addition, in the radical polymerizable resin or compound (B) containing a maleimide group, the functional group capable of reacting with the maleimide group is mainly a secondary amino group, and therefore the function of causing an addition reaction with other maleimide compounds (A) is also lost in the radical polymerizable resin or compound (B) containing a maleimide group. As a result, the ratio of polymers produced by polymerization of maleimide compounds (A) can be kept low, so that the melt viscosity of the resin composition can be made low, and it is possible to have a long time over which the resin composition has low viscosity. Note that, in a di- or higher-functional amino compound such as an amino compound having two or more secondary amino groups, polymerization excessively proceeds because there are a large number of sites where an addition reaction with the bismaleimide compound (A) occurs. As a result, the viscosity of the resin composition increases, and for example, when the resin composition is applied to an underfill material, it is not possible to achieve the minimum melt viscosity required for the underfill material. Reduction of the viscosity of the resin composition improves the mobility of polar functional groups which contribute to adhesiveness between chips, and the substrate and the underfill material, so that the underfill material easily follows asperities present on the surfaces of the chip, leading to improvement of the embedding property of the underfill material. As a result, good chemical bonds are generated between polar functional groups contained in the underfill material and silanol groups in the chip, and therefore a low-void property, low tackiness, and sufficient chip adhesiveness by anchor effect of embedment of the underfill material in the asperities on the chip is obtained. By using the radical polymerizable resin or compound (B) containing a maleimide group, excellent insulation reliability and heat resistance can be obtained because it is possible to form a network which has a maleimide group that is not a polar group having water absorbency and which is stiff.

The radical polymerizable resin or compound (B) containing a maleimide group is not particularly limited as long as it is a resin or compound having one or more maleimide groups in the molecule. One of the radical polymerizable resins or compounds (B) containing a maleimide group can be used, or two or more thereof can be mixed and used.

Examples thereof include N-phenylmaleimide, N-hydroxyphenylmaleimide, bis(4-maleimidophenyl)methane, 4,4-diphenylmethanebismaleimide, bis(3,5-dimethyl-4-maleimidophenyl)methane, bis(3-ethyl-5-methyl-4-maleimidophenyl)methane, bis(3,5-diethyl-4-maleimidophenyl)methane, phenylmethanemaleimide, o-phenylenebismaleimide, m-phenylenebismaleimide, p-phenylenebismaleimide, p-phenylenebiscitraconimide, 2,2-bis(4-(4-maleimidophenoxy)-phenyl)propane, 3,3-dimethyl-5,5-diethyl-4,4-diphenylmethanebismaleimide, 4-methyl-1,3-phenylenebismaleimide, 1,6-bismaleimido-(2,2,4-trimethyl)hexane, 4,4-diphenyl ether bismaleimide, 4,4-diphenyl sulfone bismaleimide, 1,3-bis(3-maleimidophenoxy)benzene, 1,3-bis(4-maleimidophenoxy)benzene, polyphenylmethanemaleimide, a novolac-based maleimide compound, a biphenyl aralkyl-based maleimide compound, 2,2-bis(4-(4-maleimidophenoxy)phenyl)propane, 1,2-bis(maleimido)ethane, 1,4-bis(maleimido)butane, 1,6-bis(maleimido)hexane, N,N'-1,3-phenylenedimaleimide, N,N'-1,4-phenylenedimaleimide, N-phenylmaleimide, a maleimide compound represented by the formula (2), a maleimide compound represented by the formula (3), a maleimide compound represented by the formula (4), a maleimide compound represented by the formula (5), a maleimide compound represented by the formula (6), a maleimide compound represented by the formula (7), a maleimide compound represented by the formula (10), a maleimide compound represented by the formula (11), a maleimide compound represented by the formula (12), and a maleimide compound represented by the formula (13). The radical polymerizable resin or compound (B) having a maleimide group may also be contained in the resin composition according to the present embodiment in the form of, for example, a prepolymer obtained by polymerizing the maleimide compound or a prepolymer obtained by polymerizing the maleimide compound with another compound such as an amine compound.

Among the above, from the viewpoint of solubility in an organic solvent, 2,2-bis[4-(4-maleimidophenoxy)phenyl]propane, 1,2-bis(maleimido)ethane, 1,4-bis(maleimido)butane, 1,6-bis(maleimido)hexane, N,N'-1,3-phenylenedimaleimide, N,N'-1,4-phenylenedimaleimide, N-phenylmaleimide, a maleimide compound represented by the formula (2), a maleimide compound represented by the formula (3), a maleimide compound represented by the formula (4), a maleimide compound represented by the formula (5), a maleimide compound represented by the formula (6), a maleimide compound represented by the formula (7), a maleimide compound represented by the formula (10), a maleimide compound represented by the formula (11), a maleimide compound represented by the formula (12), and a maleimide compound represented by the formula (13) are preferable, 2,2-bis[4-(4-maleimidophenoxy)phenyl]propane, a maleimide compound represented by the formula (2), a maleimide compound represented by the formula (3), a maleimide compound represented by the formula (4), a maleimide compound represented by the formula (5), a maleimide compound represented by the formula (6), a maleimide compound represented by the formula (7), a maleimide compound represented by the formula (10), a maleimide compound represented by the formula (11), a maleimide compound represented by the formula (12), and a maleimide compound represented by the formula (13) are more preferable, 2,2-bis[4-(4-maleimidophenoxy)phenyl]propane, a maleimide compound represented by the formula (2), a maleimide compound represented by the formula (4), and a maleimide compound represented by the formula (5)

are still more preferable. As the maleimide compound represented by the formula (4), bis-(3-ethyl-5-methyl-4-maleimidophenyl)methane is preferable.

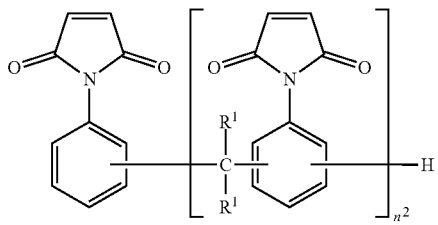

(2)

In the formula (2), each $R^1$ independently represents a hydrogen atom or a methyl group, and from the viewpoint of achieving action effects according to the present embodiment more effectively and reliably, it is preferably a hydrogen atom. In addition, in the formula (2), $n^2$ represents an integer of 1 to 10. For the upper limit value of $n^2$, it is preferable that the upper limit value should be 7 from the viewpoint of solubility in an organic solvent.

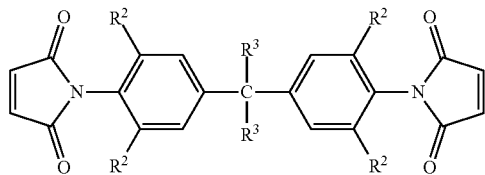

(3)

In the formula (3), $n^3$ represents an integer of 1 to 30. From the viewpoint of achieving action effects according to the present embodiment more effectively and reliably, $n^3$ is preferably an integer of 7 to 30 and more preferably an integer of 7 to 18.

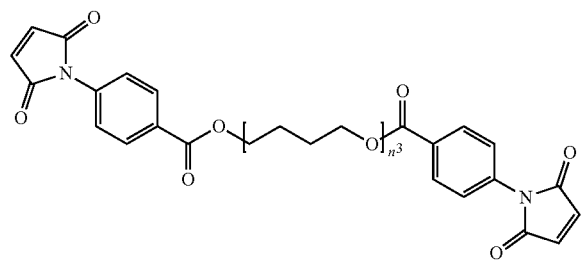

(4)

In the formula (4), each $R^2$ independently represents a hydrogen atom, a methyl group, or an ethyl group.

In the formula (4), each $R^3$ independently represents a hydrogen atom or a methyl group.

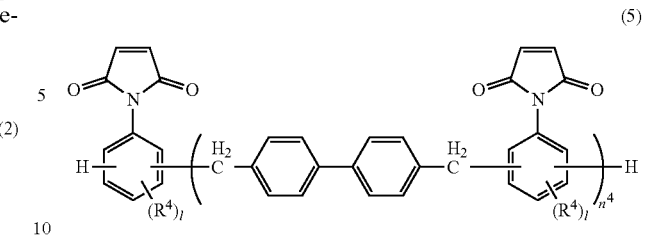

(5)

In the formula (5), each $R^4$ independently represents a hydrogen atom, an alkyl group having 1 to 5 carbon atoms, or a phenyl group; each $l$ independently represents an integer of 1 to 3; and $n^4$ represents an integer of 1 to 10.

Examples of the alkyl group having 1 to 5 carbon atoms include, for example, a methyl group, an ethyl group, a n-propyl group, an isopropyl group, a n-butyl group, an isobutyl group, a sec-butyl group, a t-butyl group, a n-pentyl group, and a neopentyl group.

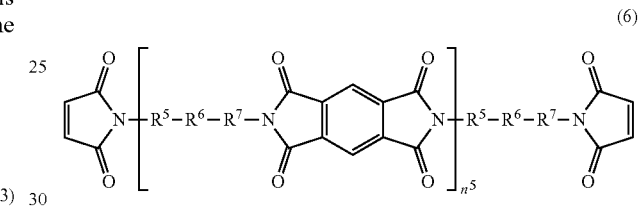

(6)

In the formula (6), $R^5$ and $R^7$ each independently represent a hydrocarbon group in which 8 or more atoms are linearly linked. Each $R^6$ independently represents a substituted or unsubstituted cyclic hydrocarbon group optionally having a heteroatom in which 4 to 10 atoms constitute the ring. $n^5$ represents an integer of 1 to 10.

For both $R^5$ and $R^7$, examples of the hydrocarbon group in which 8 or more atoms are linearly linked include, for example, a substituted or unsubstituted divalent hydrocarbon group having 8 or more carbon atoms. The substituted or unsubstituted divalent hydrocarbon group is not particularly limited, but examples thereof include a substituted or unsubstituted linear aliphatic hydrocarbon group, a substituted or unsubstituted branched aliphatic hydrocarbon group, and a substituted or unsubstituted cycloaliphatic hydrocarbon group. Examples thereof include, for example, an octylene group, a nonamethylene group, a decamethylene group, a dodecamethylene group, a hexadecamethylene group, and an octadecamethylene group.

In $R^6$, examples of the substituted or unsubstituted cyclic hydrocarbon group optionally having a heteroatom in which 4 to 10 atoms constitute the ring include, for example, a substituted or unsubstituted alicyclic group in which 4 to 10 atoms constitute the ring, a substituted or unsubstituted aromatic group in which 4 to 10 atoms constitute the ring, and a substituted or unsubstituted heterocyclic group in which 4 to 10 atoms constitute the ring. Note that the number of atoms constituting the ring means the number of atoms linked in a cyclic manner, and does not include the number of atoms of side chain substituents and the like. Examples of the group of the alicyclic part in the substituted or unsubstituted alicyclic group include, for example, a divalent group or group with 2 or more valences such as a cyclobutyl group, a cyclopentyl group, a cyclohexyl group, a cyclooctyl group, and a cyclodecyl group. In addition, when the substituent is an alkyl group, that alkyl group is not particularly limited, but an alkyl group having 1 to 10 carbon atoms is preferable, and an alkyl group having 3 to 10 carbon atoms is more preferable. Examples of the alkyl group having 1 to 10 carbon atoms include, for example, a methyl group, an ethyl group, a n-propyl group, an isopropyl group, a n-butyl group, an isobutyl group, a sec-butyl group, a t-butyl group, a n-pentyl group, a neopentyl group, a n-hexyl group, a thexyl group, a n-heptyl group, a n-octyl group, a n-ethylhexyl group, a n-nonyl group, and a n-decyl group. The alkyl group for the alkyl group substitution may be one, or may be two or more.

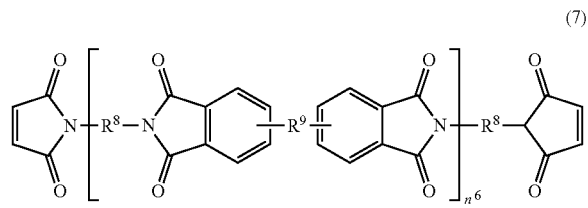

(7)

In the formula (7), each $R^8$ independently represents an alkylene group. Each $R^9$ independently represents an alkylene group, a group represented by the formula (8), a group represented by the formula "—$SO_2$—", a group represented by the formula "—CO—", a group represented by the formula (9), an oxygen atom, or a single bond. $n^6$ represents an integer of 1 to 10.

In both $R^8$ and $R^9$, the alkylene group is as described above.

(8)

In the formula (8), Z represents an alkylene group or a hydrocarbon group having an aromatic ring and having 6 to 30 carbon atoms. $n^7$ represents an integer of 0 to 5. $n^7$ is preferably an integer of 1 to 3, and more preferably 1 or 2.

In Z the alkylene group and the hydrocarbon group having 6 to 30 carbon atoms and having an aromatic ring are as described above.

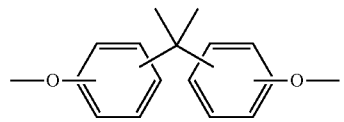

(9)

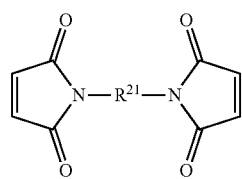

(10)

In the formula (10), $R^{21}$ represents at least one selected from a linear or branched alkylene group having 1 to 40 carbon atoms, a cyclic hydrocarbon group optionally having a heteroatom in which 3 to 20 atoms constitute the ring, an oxygen atom, a group represented by "—NH—", a sulfur atom, and a group represented by the formula "—$SO_2$—".

Examples of the linear or branched alkylene group having 1 to 40 carbon atoms include a methylene group, an ethylene group, a propylene group, a 2,2-dimethylpropylene group, a butylene group, a pentylene group, a hexylene group, a heptylene group, an octylene group, a nonylene group, a decylene group, a dodecylene group, an undecylene group, a tridecylene group, a tetradecylene group, a pentadecylene group, a hexadecylene group, an octadecylene group, a neopentylene group, a dimethylbutylene group, a methylhexylene group, an ethylhexylene group, a dimethylhexylene group, a trimethylhexylene group, a methylheptylene group, a dimethylheptylene group, a trimethylheptylene group, a tetramethylheptylene group, an ethylheptylene group, a methyloctylene group, a methylnonylene group, a methyldecylene group, a methyldodecylene group, a methylundecylene group, a methyltridecylene group, a methyltetradecylene group, a methylpentadecylene group, a methylhexadecylene group, an eicosylene group and a triaconlene group.

The cyclic hydrocarbon group optionally having a heteroatom in which 3 to 20 carbon atoms constitute the ring is as described above.

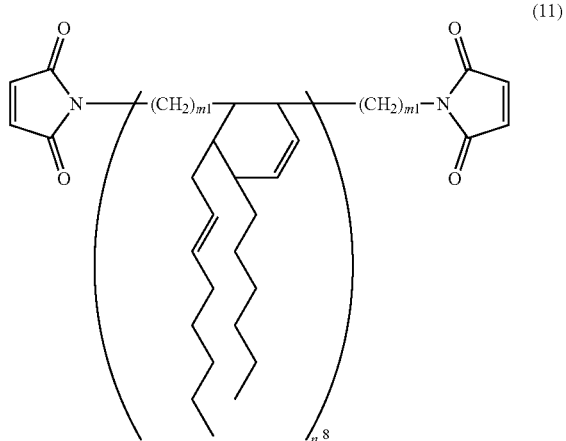

(11)

In the formula (11), $n^8$ represents an integer of 1 to 10, and m1 represents an integer of 8 to 40. $n^8$ is preferably an integer of 1 to 8. m1 is preferably an integer of 8 to 32.

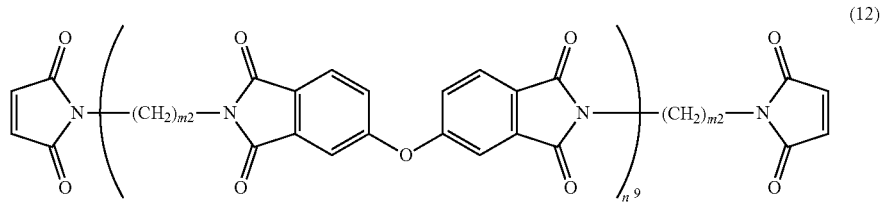

(12)

In the formula (12), $n^9$ represents an integer of 1 to 10; and m2 represents an integer of 8 to 40. $n^9$ is preferably an integer of 1 to 9. m2 is preferably an integer of 8 to 32.

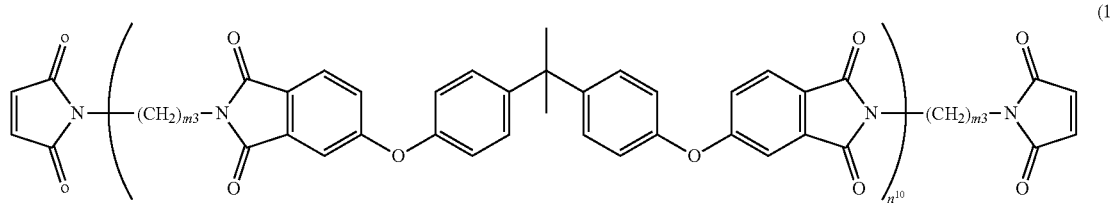

(13)

In the formula (13), $n^{10}$ represents an integer of 1 to 10; and m3 represents an integer of 8 to 40. $n^{10}$ is preferably an integer of 1 to 9. m3 is preferably an integer of 8 to 32.

From the viewpoint that good solubility in an organic solvent is obtained, so that voids can be reduced, and good flexibility is obtained, the radical polymerizable resin or compound (B) having a maleimide group is preferably a maleimide compound represented by the formula (5), more preferably contains a maleimide compound represented by the formula (5), and further at least one maleimide compound selected from 2,2-bis(4-(4-maleimidephenoxy)phenyl)propane, a maleimide compound represented by the formula (2) and a maleimide compound represented by the formula (4), and still more preferably contains all of a maleimide compound represented by formula (5), 2,2-bis(4-(4-maleimidephenoxy)phenyl)propane, a maleimide compound represented by the formula (2), and a maleimide compound represented by the formula (4).

As the radical polymerizable resin or compound (B) having a maleimide group, those commercially available may be used, and examples of 2,2-bis(4-(4-maleimidophenoxy)phenyl)propane include BMI-80 (trade name) manufactured by K•I Chemical Industry Co., LTD. Examples of the maleimide compound represented by the formula (2) include BMI-2300 (trade name, a mixture wherein all $R^1$ are hydrogen atoms and $n^2$ is 1 to 3 in the formula (2)) manufactured by Daiwa Kasei Industry Co., LTD. Examples of the maleimide compound represented by the formula (3) include, for example, BMI-1000P (trade name, $n^3$=14 (average) in the formula (3)) manufactured by K•I Chemical Industry Co., LTD., BMI-650P (trade name, $n^3$=9 (average) in the formula (3)) manufactured by K•I Chemical Industry Co., LTD., BMI-250P (trade name, $n^3$=3 to 8 (average) in the formula (3)) manufactured by K•I Chemical Industry Co., LTD., and CUA-4 (trade name, $n^3$=1 in the formula (3)) manufactured by K•I Chemical Industry Co., LTD. Examples of the maleimide compound represented by the formula (4) include, for example, BMI-70 (trade name) manufactured by K•I Chemical Industry Co., LTD. Examples of the maleimide compound represented by the formula (5) include, for example, MIR-3000-70MT (trade name, a mixture wherein all $R^4$ are hydrogen atoms and $n^4$ is 1 to 10 in the formula (5)) manufactured by Nippon Kayaku Co., Ltd. Examples of the maleimide compound represented by the formula (6) include BMI-3000 (trade name) and BMI-5000 (trade name) manufactured by Designer Molecules Inc. Examples of the maleimide compound represented by the formula (7) include BMI-6000 (trade name) manufactured by Designer Molecules Inc. Examples of the maleimide compound represented by the formula (10) include BMI-TMH (trade name) manufactured by Daiwa Kasei Industry Co., LTD and MAHD (trade name) manufactured by Evonik Industries AG. Examples of the maleimide compound represented by the formula (11) include BMI-689 (trade name) manufactured by Designer Molecules Inc. Examples of the maleimide compound represented by the formula (12) include BMI-1500 (trade name) manufactured by Designer Molecules Inc. Examples of the maleimide compound represented by the formula (13) include BMI-1700 (trade name) manufactured by Designer Molecules Inc.

In the resin composition of the present embodiment, the content of the radical polymerizable resin or compound (B) is not particularly limited, and is preferably 1 part by mass to 99 parts by mass, more preferably 5 parts by mass to 97 parts by mass, still more preferably 10 parts by mass to 95 parts by mass, and furthermore preferably 15 parts by mass to 90 parts by mass, furthermore preferably 20 parts by mass to 85 parts by mass based on 100 parts by mass of the total of the bismaleimide compound (A) and the radical polymerizable resin or compound (B), from the viewpoint that it becomes possible to obtain a cured product mainly composed of the bismaleimide compounds (A), curability is further improved, and further a low-void property can be obtained.

When in the resin composition of the present embodiment, a maleimide compound represented by the formula (5) is contained as the radical polymerizable resin or compound (B) having a maleimide group, without particular limitations, the maleimide compound represented by the formula (5) is preferably contained at 5 parts by mass or more and 70 parts by mass or less, and more preferably contained at 10 parts by mass to 60 parts by mass based on 100 parts by mass in total of the bismaleimide compound (A) and the radical polymerizable resin or compound (B) containing a maleimide group according to the present embodiment, from the viewpoint of obtaining good solubility in an organic solvent and good flexibility.

When in the resin composition of the present embodiment, the radical polymerizable resin or compound (B) having a maleimide group contains a maleimide compound represented by the formula (5), 2,2-bis(4-(4-maleimidephenoxy)phenyl)propane, a maleimide compound represented by the formula (2), and a maleimide compound represented by the formula (4), without particular limitations, the resin composition preferably contains the bismaleimide compound (A) at 15 parts by mass to 65 parts by mass, the maleimide compound represented by the formula (5) at 5 parts by mass to 82 parts by mass, 2,2-bis(4-(4-maleimidephenoxy)phenyl)propane at 1 part by mass to 10 parts by mass, the maleimide compound represented by the formula (2) at 1 part by mass to 10 parts by mass and the maleimide compound represented by the formula (4) at 1 part by mass to 10 parts by mass, more preferably contains the bismaleimide compound (A) at 22 parts by mass to 65 parts by mass, the maleimide compound represented by the formula (5) at 5 parts by mass to 75 parts by mass, 2,2-bis(4-(4-maleimidephenoxy)phenyl)propane at 1 part by mass to 15 parts by mass, the maleimide compound represented by the formula (2) at 1 part by mass to 5 parts by mass and the maleimide compound represented by the formula (4) at 1 part by mass to 10 parts by mass, based on 100 parts in total of the bismaleimide compound (A) and the radical polymerizable resin or compound (B) according to the present embodiment, from the viewpoint of obtaining better flexibility, further a low-void property and further excellent chip adhesiveness while having excellent tackiness and transmittivity.

The radical polymerizable resin or compound (B) having a (meth)acryloyl group as a polymerizable functional group is not particularly limited as long as it is a compound having one or more (meth)acryloyl groups in the molecule. Examples thereof include methyl (meth)acrylate, ethyl (meth)acrylate, isopropyl (meth)acrylate, isobutyl (meth)acrylate, ethylene glycol di(meth)acylate, diethylene glycol di(meth)acylate, trimethylolpropane tri(meth)acrylate, tetramethylolmethane tetra(meth)acrylate, 2-hydroxy-1,3-di(meth)acryloxypropane, 2,2-bis[4-((meth)acryloxymethoxy)phenyl]propane, 2,2-bis[4-((meth)acryloxypolyethoxy)phenyl]propane, dicyclopentenyl (meth)acrylate, tricyclodecanyl (meth)acrylate, tris((meth)acryloyloxyethyl)isocyanurate and urethane (meth)acrylate. One of the resins or compounds (B) having a (meth)acryloyl group can be used, or two or more thereof can be mixed and used.

The radical polymerizable resin or compound (B) containing an allyl group as a polymerizable functional group is not particularly limited as long as it is a resin or compound having one or more allyl groups in the molecule. Examples thereof include tri(meth)allyl cyanurate, tri(meth)allyl isocyanurate, tri(meth)allyl trimellitate, tetra(meth)allyl pyromellitate, and pentaerythritol tri(meth)allyl ether. One of the resins or compounds (B) having an allyl group can be used, or two or more thereof can be mixed and used.

Curing Accelerator (C)

The resin composition of the present embodiment further contains a curing accelerator. When the resin composition of the present embodiment contains a curing accelerator, the curing rate can be adjusted, and a resin composition having moderate moldability can be obtained. The curing accelerator in the present embodiment is not particularly limited as long as it is a compound capable of accelerating curing of the bismaleimide compound (A) and the radical polymerizable resin or compound (B) according to the present embodiment. One of the curing accelerators (C) can be used, or two or more thereof can be mixed and used.

The curing accelerator in the present embodiment is not particularly limited, and examples thereof include thermal radical polymerization initiators (D), imidazole compounds (E) and tertiary amines such as triethylamine and tributylamine. Among the above, at least one selected from the thermal radical polymerization initiator (D) and the imidazole (E) is preferably contained, and both the thermal radical polymerization initiator (D) and the imidazole compound (E) are more preferably contained, from the viewpoint of obtaining a good curing rate.

In the present embodiment, the content of the curing accelerator (C) is not particularly limited, and the curing accelerator is preferably contained at 0.05 parts by mass to 10 parts by mass, and more preferably contained at 0.05 parts by mass to 8 parts by mass, based on 100 parts by mass in total of the bismaleimide compound (A) according to the present embodiment and the radical polymerizable resin or compound (B) according to the present embodiment, from the viewpoint of obtaining a good curing rate.

Thermal Radical Polymerization Initiator (D)

The thermal radical polymerization initiator (D) according to the present embodiment is not particularly limited as long as it is a compound which releases active substances (radicals) capable of polymerizing maleimide groups in the bismaleimide compound (A) according to the present embodiment and polymerizable functional groups in the radical polymerizable resin or compound (B) according to the present embodiment by heat, and a known thermal radical initiator can be used. One of the thermal radical polymerization initiators (D) can be used, or two or more thereof can be mixed and used.

In the present embodiment, the 10 hour half-life period temperature of the thermal radical polymerization initiator (D) is not particularly limited, and is preferably 100° C. or higher, and is more preferably 110° C. or higher from the viewpoint of producibility. In the present embodiment, it is preferable that the 10 hour half-life period temperature of the thermal radical polymerization initiator (D) should satisfy the range described above because the temperature during the solvent removal step upon production can be increased.

Examples of the thermal radical polymerization initiator include an organic peroxide including a ketone peroxide such as dicumyl peroxide, di(2-tert-butylperoxyisopropyl) benzene, 1,1,3,3-tetramethylbutyl hydroperoxide, 2,5-dimethyl-2,5-bis(tert-butylperoxy)hexyne-3, benzoyl peroxide, di-t-butyl peroxide, methyl ethyl ketone peroxide, and cyclohexanone peroxide; a peroxy ketal such as 1,1-di(t-butylperoxy)cyclohexane and 2,2-di(4,4-di(t-butylperoxy)cyclohexyl)propane; a hydroperoxide such as tert-butyl hydroperoxide, p-menthane hydroperoxide, diisopropylbenzene hydroperoxide, cumene hydroperoxide, and t-butyl hydroperoxide; a dialkyl peroxide such as di(2-t-butylperoxyisopropyl)benzene, 2,5-dimethyl-2,5-di(t-butylperoxy)hexane, t-butyl cumyl peroxide, di-t-hexyl peroxide, 2,5-dimethyl-2,5-di(t-butylperoxy)hexyne-3, and di-t-butyl peroxide; a diacyl peroxide such as dibenzoyl peroxide and di(4-methylbenzoyl) peroxide; a peroxy dicarbonate such as di-n-propyl peroxydicarbonate and diisopropyl peroxydicarbonate; a peroxy ester such as 2,5-dimethyl-2,5-di(benzoylperoxy)hexane, t-hexyl peroxybenzoate, t-butyl peroxybenzoate, and t-butyl peroxy-2-ethyl hexanoate; an azo compound such as 2,2'-azobisbutyronitrile, 2,2'-azobis(2,4-dimethylvaleronitrile), and 2,2'-azobis(4-methoxy-2,4-dimethylvaleronitrile). In the present embodiment, an organic peroxide is preferable from the viewpoint of obtaining a good curing rate; an organic peroxide having a peroxy ester, peroxy ketal, dialkyl peroxide, or hydroperoxide skeleton is more preferable; and dicumyl peroxide, di(2-tert-butylperoxyisopropyl)benzene, 1,1,3,3-tetramethylbutyl hydroperoxide, 2,5-dimethyl-2,5-bis(tert-butylperoxy)hexyne-3, and tert-butyl hydroperoxide are still more preferable from the viewpoint of producibility.

In the resin composition of the present embodiment, the content of the thermal radical polymerization initiator (D) is not particularly limited, and the thermal radical polymerization initiator (D) is preferably contained at 0.05 parts by mass to 10 parts by mass, and more preferably contained at 0.05 parts by mass to 8 parts by mass, based on 100 parts by mass in total of the bismaleimide compound (A) according to the present embodiment and the radical polymerizable resin or compound (B) according to the present embodiment, from the viewpoint of obtaining a good curing rate.

Imidazole Compound (E)

The imidazole compound (E) according to the present embodiment is not particularly limited as long as it is an imidazole compound capable of accelerating curing of the bismaleimide compound (A) and the radical polymerizable resin or compound (B) according to the present embodiment, and a known imidazole compound can be used. One of the imidazole compounds (E) can be used, or two or more thereof can be mixed and used.

Examples of the imidazole compound (E) include 2-ethyl-4-methylimidazole, 2-phenyl-4-methylimidazole, 1-benzyl-2-phenylimidazole, 2,4,5-triphenylimidazole, tertiary amines such as triethylamine and tributylamine, and derivatives thereof. Among them, 2-ethyl-4-methylimidazole is preferable from the viewpoint that adjustment of the curing rate is easy.

In the resin composition of the present embodiment, the content of the imidazole compound (E) is not particularly limited, and the imidazole compound (E) is preferably contained at 0.05 parts by mass to 10 parts by mass, and more preferably contained at 0.05 parts by mass to 8 parts by mass, based on 100 parts by mass in total of the bismaleimide compound (A) according to the present embodiment and the radical polymerizable resin or compound (B) according to the present embodiment, from the viewpoint that adjustment of the curing rate is easy.

Thermosetting Compound (F)

Without particular limitations, it is preferable that the resin composition of the present embodiment further contain a thermosetting compound (F) other than the bismaleimide compound (A) according to the present embodiment and the radical polymerizable resin or compound (B) according to the present embodiment from the viewpoint that adjustment of the curing rate is easy. The thermosetting compound (F) according to the present embodiment is not particularly limited, and a known compound can be used as long as it is a compound having reactivity with the bismaleimide compound (A) and the radical polymerizable resin or compound (B) according to the present embodiment. Preferably, the thermosetting compound (F) does not have reactivity with the later-described organic compound (H) having the flux function.

The molecular weight of the thermosetting compound (F) is not particularly limited, and is preferably 400 or more from the viewpoint of preventing voids caused by volatilization of the thermosetting compound (F) during the flip chip bonding. On the other hand, from the viewpoint of obtaining more sufficient flux activity, the molecular weight of the thermosetting compound (F) is preferably 10,000 or less.

The thermosetting compound (F) is not particularly limited, and examples thereof include a compound having an alkenyl group, a compound having a (meth)acryloyl group, and a benzoxazine compound. Among the thermosetting compounds (F), a benzoxazine compound is preferably contained from the viewpoint of obtaining excellent flame retardancy, heat resistance, adhesiveness, and solubility in an organic solvent. One of these thermosetting compounds (F) can be used, or two or more thereof can be mixed and used.

The compound having an alkenyl group is not particularly limited as long as it is a compound having one or more carbon-carbon double bonds in the molecule, and is a compound other than the radical polymerizable resin or compound (B) according to the present embodiment, and examples thereof include a compound having a vinyl group, and a compound having a (meth)allyl group.

Examples of the compound having the vinyl group include divinylbenzene, divinylnaphthalene, styrene, and a styrene derivative. One of these compounds having the vinyl group can be used, or two or more thereof can be mixed and used.

The benzoxazine compound is not particularly limited as long as it has an oxazine ring as the basic skeleton. In the present embodiment, the benzoxazine compound also encompasses compounds having a polycyclic oxazine skeleton, such as naphthoxazine compounds. The benzoxazine compound does not generate a volatile by-product by heating, and the benzoxazine ring undergoes the ring opening polymerization and is suitably cured. The cured product is excellent in heat resistance, water resistance, and flame retardancy. In addition, the benzoxazine compound is expected to have high chip adhesiveness and substrate adhesiveness because a phenolic hydroxy group and a tertiary amino group, which are polar groups, are produced upon the ring opening polymerization. One of the benzoxazine compounds can be used, or two or more thereof can be mixed and used.

As the benzoxazine compound, at least one selected from a compound represented by the formula (14), a compound represented by the formula (15), a compound represented by the formula (16) and a compound represented by the formula (17) is preferably contained. Note that, in the present embodiment, oligomers produced by polymerizing monomers or the like may be contained in the benzoxazine compound.

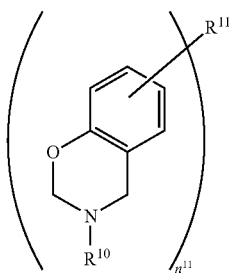

(14)

In the formula (14), $R^{10}$ represents an aryl group, an aralkyl group, an alkenyl group, an alkyl group, or a cycloalkyl group. $R^{11}$ represents a hydrogen atom, an aryl group, an aralkyl group, an alkenyl group, an alkyl group, a cycloalkyl group, or a monovalent to tetravalent organic group represented by the general formulas (a) to (t). $n^{11}$ represents an integer of 1 to 4.

For both $R^{10}$ and $R^{11}$, the aryl group is preferably an aryl group having 6 to 18 carbon atoms. Examples of such an aryl group include a phenyl group, a naphthyl group, an indenyl group, a biphenyl group, and an anthryl group. Among them, a phenyl group is more preferable. These aryl groups have one or more, preferably one to three lower alkyl groups having 1 to 4 carbon atoms. Examples of the aryl group having such a lower alkyl group can include a tolyl group, a xylyl group, and a methylnaphthyl group.

For both $R^{10}$ and $R^{11}$, the aralkyl group is preferably a benzyl group or a phenethyl group. These have one or more, preferably one to three lower alkyl groups having 1 to 4 carbon atoms on the phenyl group thereof.

For both $R^{10}$ and $R^{11}$, examples of the alkenyl group include a vinyl group, a (meth)allyl group, a propenyl group, a butenyl group, and a hexenyl group. Among the above, a vinyl group, an allyl group and a propenyl group are preferable, and an allyl group is more preferable.

For both $R^{10}$ and $R^{11}$, the alkyl group is preferably an alkyl group having 1 to 20 carbon atoms, more preferably an alkyl group having 1 to 10 carbon atoms. The alkyl group having 3 or more carbon atoms may be linear or branched. Examples thereof include a methyl group, an ethyl group, a n-propyl group, an isopropyl group, a n-butyl group, an isobutyl group, a sec-butyl group, a t-butyl group, a n-pentyl group, a neopentyl group, a n-hexyl group, a thexyl group, a n-heptyl group, a n-octyl group, a n-ethylhexyl group, a n-nonyl group and a n-decyl group.

For both $R^{10}$ and $R^{11}$, examples of the cycloalkyl group include a cyclopentyl group, a cyclohexyl group, and a cycloheptyl group. Preferred is a cyclohexyl group.

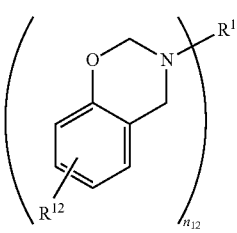

(15)

In the formula (15), $R^{12}$ represents a hydrogen atom, an aryl group, an aralkyl group, an alkenyl group, an alkyl group, or a cycloalkyl group. $R^{13}$ represents an aryl group, an aralkyl group, an alkenyl group, an alkyl group, a cycloalkyl group, or a monovalent to tetravalent organic group represented by the general formulas (a) to (t). $n^{12}$ represents an integer of 1 to 4.

For both $R^{12}$ and $R^{13}$, the aryl group, the aralkyl group, the alkenyl group, the alkyl group, and the cycloalkyl group are as described above.

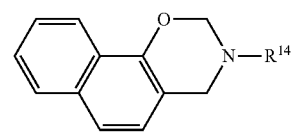

(16)

In the formula (16), $R^{14}$ represents an alkyl group, a cycloalkyl group, or a phenyl group optionally having a substituent.

The alkyl group and the cycloalkyl group in $R^{14}$ are as described above.

Examples of the phenyl group optionally having a substituent include, for example, an unsubstituted phenyl group; a monosubstituted phenyl group such as a 4-methylphenyl group, a 3-methoxyphenyl group, a 4-cyclohexylphenyl group, and a 4-methoxyphenyl group; a disubstituted phenyl group such as a 3,5-dimethylphenyl group, a 3,4-dimethylphenyl group, and a 3,5-dimethoxyphenyl group; a trisubstituted phenyl group such as a 3,4,5-trimethylphenyl group; and a 2-naphthyl group optionally having a substituent such as a 2-naphthyl group, a 3-methyl-2-naphthyl group, and a 4-methyl-2-naphthyl group.

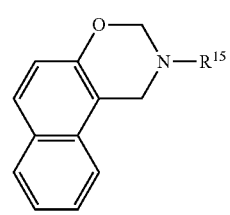

(17)

In the formula (17), $R^{15}$ represents an alkyl group, a cycloalkyl group, or a phenyl group optionally having a substituent.

The alkyl group, the cycloalkyl group, or the phenyl group optionally having the substituent in $R^{15}$ are as described above.

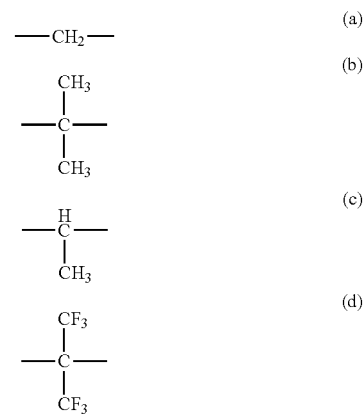

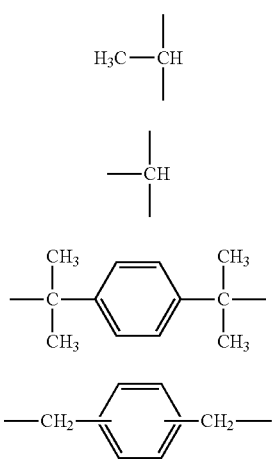

(e)
(f)
(g)
(h)
(i)
(j)
(k)

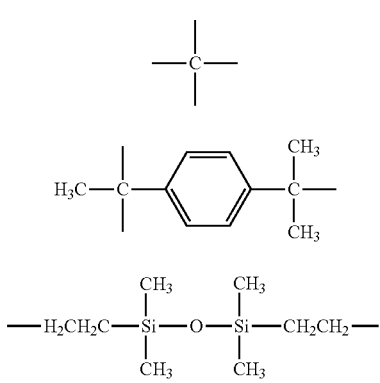

(l)

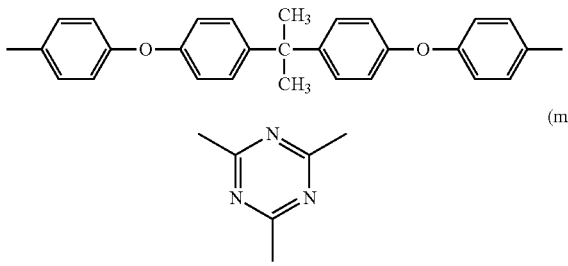

(m)

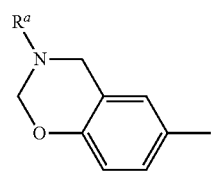

(n)

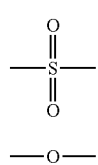

(o)

(p)

(q)

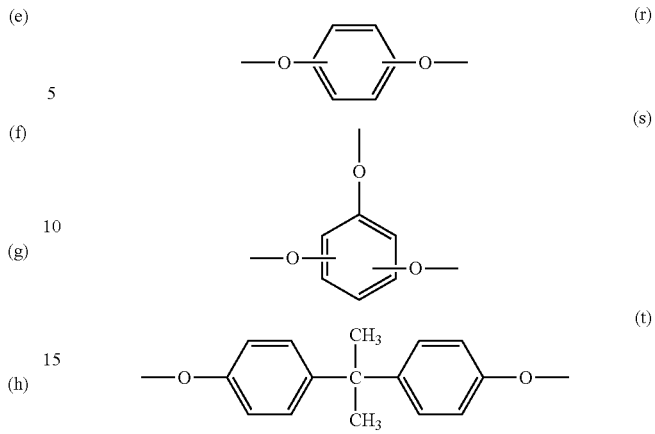

(r)
(s)
(t)

In the general formulas (a) to (t), $R^a$ represents an aryl group, an aralkyl group, an alkenyl group, an alkyl group, or a cycloalkyl group. $R^b$ represents a hydrogen atom, an aryl group, an aralkyl group, an alkenyl group, an alkyl group, or a cycloalkyl group.

For both $R^a$ and $R^b$, the aryl group, the aralkyl group, the alkenyl group, the alkyl group, and the cycloalkyl group are as described above.

As the benzoxazine compound, at least one selected from a compound represented by the formula (18), a compound represented by the formula (19) and a compound represented by the formula (20) is preferably contained from the viewpoint of obtaining excellent flame retardancy and heat resistance.

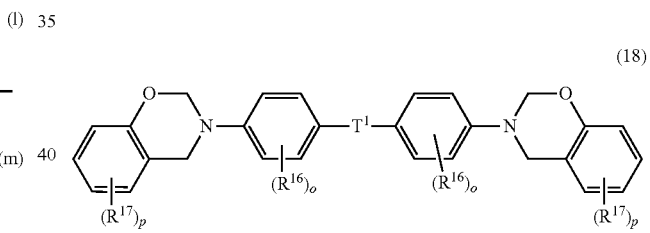

(18)

In the formula (18), each $R^{16}$ independently represents a hydrogen atom, an aryl group, an aralkyl group, an alkenyl group, an alkyl group, or a cycloalkyl group. Each o independently represents an integer of 1 to 4. Each $R^{17}$ independently represents a hydrogen atom, an aryl group, an aralkyl group, an alkenyl group, an alkyl group, or a cycloalkyl group. Each p independently represents an integer of 1 to 4. $T^1$ represents an alkylene group, a group represented by the formula (8), a group represented by the formula "—$SO_2$—", a group represented by the formula "—CO—", an oxygen atom, or a single bond.

For both $R^{16}$ and $R^{17}$, the aryl group, the aralkyl group, the alkenyl group, the alkyl group, and the cycloalkyl group are as described above.

The alkylene group in $T^1$ is preferably a linear or branched alkylene group. Examples of the linear alkylene group include a methylene group, an ethylene group, a propylene group, a butylene group, a pentylene group, a hexylene group, a heptylene group, an octylene group, a nonylene group, a decanylene group, a trimethylene group, a tetramethylene group, a pentamethylene group, a hexamethylene group, and an octadecylene group. Examples of the branched alkylene group include alkylmethylene groups such as —C(CH$_3$)$_2$—, —CH(CH$_3$)—, —CH(CH$_2$CH$_3$)—, —C(CH$_3$)(CH$_2$CH$_3$)—, —C(CH$_3$)(CH$_2$CH$_2$CH$_3$)—, and —C(CH$_2$CH$_3$)—; and alkylethylene groups such as —CH(CH$_3$)CH$_2$—, —CH(CH$_3$)CH(CH$_3$)—, —C(CH$_3$)$_2$CH$_2$—, —CH(CH$_2$CH$_3$)CH$_2$—, and —C(CH$_2$CH$_3$)$_2$—CH$_2$—.

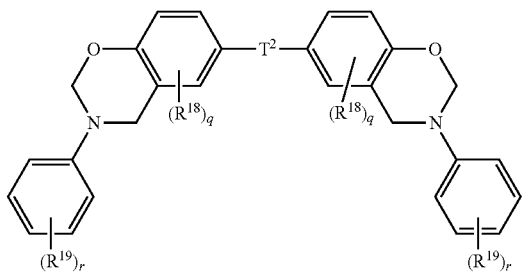

(19)

In the formula (19), each R$^{18}$ independently represents a hydrogen atom, an aryl group, an aralkyl group, an alkenyl group, an alkyl group, or a cycloalkyl group. Each q independently represents an integer of 1 to 3. Each R$^{19}$ independently represents a hydrogen atom, an aryl group, an aralkyl group, an alkenyl group, an alkyl group, or a cycloalkyl group. Each r independently represents an integer of 1 to 5. T$^2$ represents an alkylene group, a group represented by the formula (8), a group represented by the formula "—SO$_2$—", a group represented by the formula "—CO—", an oxygen atom, or a single bond.

For both R$^{18}$ and R$^{19}$, the aryl group, aralkyl group, alkenyl group, alkyl group and cycloalkyl group are as described above. The alkylene group in T$^2$ is as described above.

(8)

In the formula (8), Z represents an alkylene group or a hydrocarbon group having an aromatic ring and having 6 to 30 carbon atoms. n$^7$ represents an integer of 0 to 5. n$^7$ is preferably an integer of 1 to 3, and more preferably 1 or 2.

The alkylene group in Z is as described above.

Examples of the hydrocarbon group having 6 to 30 carbon atoms and an aromatic ring include divalent groups obtained by removing two hydrogen atoms from a nucleus of an aromatic compound such as benzene, biphenyl, naphthalene, anthracene, fluorene, phenanthrene, indacene, terphenyl, acenaphthylene, and phenalene.

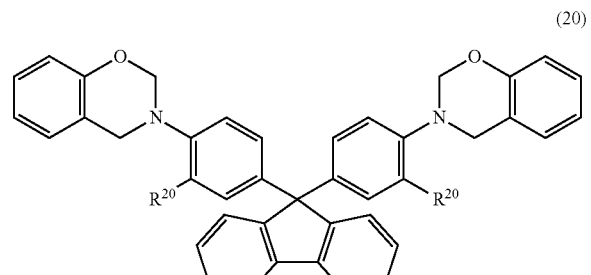

(20)

In the formula (20), each R$^{20}$ independently represents a hydrogen atom or a hydrocarbon group having 1 to 4 carbon atoms.

In the resin composition of the present embodiment, the compound represented by the formula (18) preferably contains a compound represented by the formula (21) and/or a compound represented by the formula (22) from the viewpoint of obtaining excellent flame retardancy and heat resistance. In addition, in the resin composition of the present embodiment, the compound represented by the formula (19) preferably contains at least one selected from a compound represented by the formula (23), a compound represented by the formula (24) and a compound represented by the formula (25) from the viewpoint of being excellent in solubility in an organic solvent. Among them, a compound represented by the formula (21) is more preferably contained in the resin composition of the present embodiment from the viewpoint of obtaining more excellent flame retardancy, heat resistance and solubility in an organic solvent.

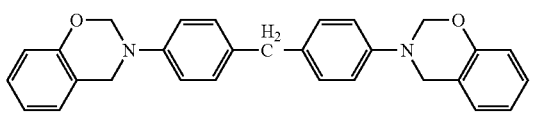

(21)

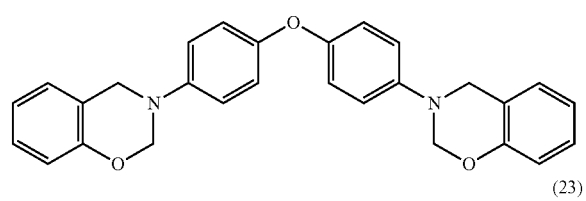

(22)

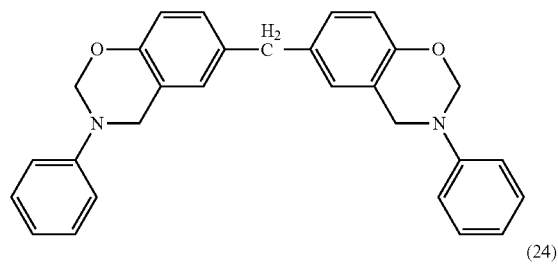

(23)

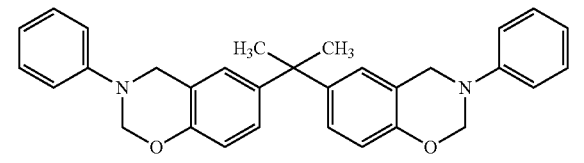

(24)

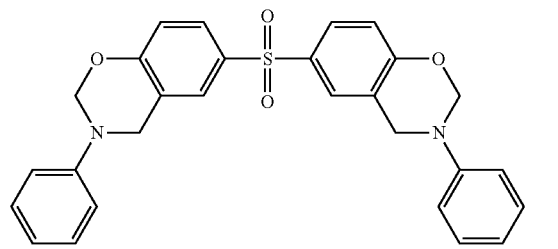

(25)

As the benzoxazine compound, commercial products can also be used. Examples thereof include P-d-based benzoxazine (3,3'-(methylene-1,4-diphenylene)bis(3,4-dihydro- 2H-1,3-benzoxazine), hydroxyl group equivalent: 217, molecular weight: 434, manufactured by Shikoku Chemicals Corporation), and F-a-based benzoxazine (2,2-bis(3,4-dihydro-2H-3-phenyl-1,3-benzoxazinyl)methane, hydroxyl group equivalent: 217, molecular weight: 434, manufactured by Shikoku Chemicals Corporation).

One of these benzoxazine compounds can be used, or two or more thereof can be mixed and used.

When the resin composition of the present embodiment contains the thermosetting compound (F), the content of the thermosetting compound (F) is not particularly limited, and is preferably 1 part by mass to 99 parts by mass, more preferably 5 parts by mass to 80 parts by mass, and still more preferably 10 parts by mass to 60 parts by mass, based on 100 parts by mass in total of the bismaleimide compound (A) according to the present embodiment and the radical polymerizable resin or compound (B) according to the present embodiment, from the viewpoint of having good chip adhesiveness and flexibility.

Inorganic Filler (G)

It is preferable that the resin composition of the present embodiment further comprise an inorganic filler (G) in order to improve burning resistance, to improve thermal conductivity, and to reduce the thermal expansion coefficient. By using an inorganic filler, the burning resistance and thermal conductivity of the resin composition and the like can be improved, and the thermal expansion coefficient can be reduced.

Although the average particle diameter of the inorganic filler (G) is not particularly limited, it is preferably 3 μm or less and more preferably 1 μm or less from the viewpoint of coping with narrower electrode pitch arranged on the chip and narrower gap between the electrodes when the resin composition of the present embodiment is used as an underfill material, preferably as a pre-applied underfill material. The lower limit value of the average particle diameter is not particularly limited, but it is, for example, 10 nm. Note that, in the present embodiment, the "average particle diameter" of the inorganic filler (G) means the median diameter of the inorganic filler (G). Here, the median diameter means a certain particle diameter such that, when the particle size distribution of powder is divided into two parts based on that particle diameter, the volume of particles on the side of larger particle diameter and the volume of particles on the side of smaller particle diameter each account for 50% of the entire powder. The average particle diameter (median diameter) of the inorganic filler (G) is measured according to the wet laser diffraction scattering method.

The inorganic filler (G) is not particularly limited, but examples thereof include, for example, a silica such as natural silica, fused silica, amorphous silica, and hollow silica; an aluminum compound such as boehmite, aluminum hydroxide, alumina, and aluminum nitride; a magnesium compound such as magnesium oxide and magnesium hydroxide; a calcium compound such as calcium carbonate and calcium sulfate; a molybdenum compound such as molybdenum oxide and zinc molybdate; boron nitride; barium sulfate; a talc such as natural talc and calcined talc; mica; and a glass such as short fibrous glass, spherical glass, and fine powder glass (for example, E glass, T glass, D glass). In addition, when it is desired to impart electrical conductivity or anisotropic electrical conductivity to the resin composition of the present embodiment, metal particles of, for example, gold, silver, nickel, copper, tin alloy, and palladium may be used as the inorganic filler (G).

Among the above, from the viewpoint of improving the burning resistance and reducing the thermal expansion coefficient of the resin composition of the present embodiment, as the inorganic filler (E), silica, aluminum hydroxide, alumina, boehmite, boron nitride, aluminum nitride, magnesium oxide, and magnesium hydroxide are preferable, and silica, alumina, and boron nitride are more preferable. Among the above, silica is still more preferable. Examples of the silica include, for example, SFP-120MC (trade name) and SFP-130MC (trade name) manufactured by Denka Company Limited; and 0.3 μm SX-CM1 (trade name), 0.3 μm SX-EM1 (trade name), 0.3 μm SV-EM1 (trade name), SC1050-MLQ (trade name), SC2050-MNU (trade name), SC2050-MTX (trade name), 2.2 μm SC6103-SQ (trade name), SE2053-SQ (trade name), YA050C-MJE (trade name), YA050C-MJF (trade name), and YA050C-MJA (trade name) manufactured by Admatechs Company Limited.

One of these inorganic fillers (G) can be used alone, or two or more thereof can be appropriately mixed and used.

As the inorganic filler (G), those surface-treated with a silane coupling agent may be used.

The silane coupling agent is not particularly limited as long as it is a silane coupling agent generally used for the surface treatment of inorganic matters. Examples thereof include, for example, a vinylsilane-based silane coupling agent such as vinyltrimethoxysilane and γ-methacryloxypropyltrimethoxysilane; a phenylaminosilane-based silane coupling agent such as N-phenyl-3-aminopropyltrimethoxysilane; a phenylsilane-based silane coupling agent such as trimethoxyphenylsilane; and an imidazolesilane-based silane coupling agent. One of these silane coupling agents can be used alone, or two or more thereof can be appropriately mixed and used.

When the resin composition of the present embodiment contains the inorganic filler (G), the content of the inorganic filler (G) is not particularly limited, and is preferably 500 parts by mass or less, and more preferably 300 parts by mass or less, based on 100 parts by mass in total of the bismaleimide compound (A) according to the present embodiment and the radical polymerizable resin or compound (B) according to the present embodiment, from the viewpoint of ensuring the flowability of an underfill material, preferably a pre-applied underfill material upon joining while improving the burning resistance and reducing the thermal expansion coefficient of the resin composition. In addition, the content is preferably 10 parts by mass or more, more preferably 20 parts by mass or more, and still more preferably 50 parts by mass or more.

Organic Compound (H) Having Flux Function

It is preferable that the resin composition of the present embodiment further comprise the organic compound (H) having the flux function in order to exhibit flux activity during the flip chip bonding. The organic compound (H) having the flux function is not particularly limited as long as it is an organic compound having one or more acid sites in the molecule. As the acid site, for example, a phosphoric acid group, a phenolic hydroxy group, a carboxyl group, and a sulfonic acid group are preferable, and a phenolic hydroxy group or a carboxyl group is more preferable from the viewpoint of more effectively preventing migration of a metal constituting the joint, such as solder and copper, and corrosion in a semiconductor device using the resin composition of the present embodiment as an underfill material, preferably as a pre-applied underfill material. One of the organic compounds (H) having the flux function can be used alone, or two or more thereof can be appropriately mixed and used.

The organic compound (H) having the flux function is not particularly limited, and preferably has an acid dissociation constant pKa of 3.8 to 15.0 in order to sufficiently remove the oxide film from the joint, and more preferably has an acid dissociation constant pKa of 4.0 to 14.0 from the viewpoint of achieving both storage stability and flux activity of the varnish and the resin laminate.

The organic compound (H) having the flux function in the resin composition of the present embodiment is not particularly limited, and preferably has a molecular weight of 200 or more, and more preferably has a molecular weight of 250 or more from the viewpoint of preventing the organic compound (H) having the flux function from being volatilized before the flux activity is exhibited during the flip chip bonding, that is, from being volatilized before the oxide film is removed from the joint. In order that the organic compound (H) having the flux function has mobility as an acid and sufficient flux activity is obtained, the molecular weight thereof is preferably 8000 or less, more preferably 1000 or less, and still more preferably 500 or less.

The organic compound (H) having the flux function is not particularly limited, but examples thereof include, for example, abietic acid, neoabietic acid, dehydroabietic acid, pimaric acid, isopimaric acid, palustric acid, diphenolic acid, dihydroabietic acid, tetrahydroabietic acid, a rosin acid-modified resin such as rosin-modified maleic acid resin, N,N'-bis(salicylidene)-1,2-propanediamine, N,N'-bis(salicylidene)-1,3-propanediamine, and phenolphthalin. These organic compounds (H) having the flux function are preferable from the standpoint of excellent solvent solubility and storage stability.

Among the above, from the viewpoint of preventing deactivation caused by the bismaleimide compound (A) according to the present embodiment and the radical polymerizable resin or compound (B) according to the present embodiment, dehydroabietic acid, diphenolic acid, dihydroabietic acid, tetrahydroabietic acid, a rosin acid-modified resin such as rosin-modified maleic acid resin, N,N'-bis(salicylidene)-1,2-propanediamine, and N,N'-bis(salicylidene)-1,3-propanediamine are more preferable. Since dehydroabietic acid, dihydroabietic acid, a rosin acid-modified resin such as rosin-modified maleic acid resin, N,N'-bis(salicylidene)-1,2-propanediamine, and N,N'-bis(salicylidene)-1,3-propanediamine have relatively low reactivity, they hardly react with the bismaleimide compound (A) according to the present embodiment and the radical polymerizable resin or compound (B) according to the present embodiment, and are thus still more preferable from the viewpoint of maintaining sufficient flux activity necessary for removing the oxide film.

As the organic compound (H) having the flux function, commercial products may be used, and examples thereof include MALKYD No. 32 ((trade name), acid value: 140 or less, manufactured by Arakawa Chemical Industries, Ltd.), MALKYD No. 31 ((trade name), acid value: 200 or less, manufactured by Arakawa Chemical Industries, Ltd.) and MALKYD No. 33 ((trade name), acid value: 290 to 320, manufactured by Arakawa Chemical Industries, Ltd.).

When the resin composition of the present embodiment contains the organic compound (H) having the flux function, the content of the organic compound (H) having the flux function is not particularly limited, and is preferably 1 part by mass to 60 parts by mass, more preferably 5 parts by mass to 50 parts by mass, and still more preferably 10 parts by mass to 45 parts by mass, based on 100 parts by mass in total of the bismaleimide compound (A) according to the present embodiment and the radical polymerizable resin or compound (B) according to the present embodiment, from the viewpoint of having both flux activity and flexibility of the resin composition, the flexibility being one of important characteristics when a laminate is formed and used.

Additional Component

The resin composition of the present embodiment may comprise, in addition to the bismaleimide compound (A), the radical polymerizable resin or compound (B), the curing accelerator (C) such as the thermal radical polymerization initiator (D) and the imidazole compound (E), the thermosetting compound (F), the inorganic filler (G) and the organic compound (H) having the flux function, one or more other components.

Examples of the additional component include, but are not particularly limited to, a flexibility imparting component. The flexibility imparting component is not particularly limited as long as it is a component that can impart flexibility to a layer containing the resin composition, and examples thereof include thermoplastic polymer compounds other than the bismaleimide compound (A), the radical polymerizable resin or compound (B), the thermosetting compound (F) and the organic compound (H) having the flux function according to the present embodiment, such as polyimide, polyamide imide, polystyrene, polyolefin, styrene-butadiene rubber (SBR), isoprene rubber (IR), butadiene rubber (BR), (meth)acrylonitrile-butadiene rubber (NBR), polyurethane, polypropylene, (meth)acrylic oligomers, (meth)acrylic polymers, and silicone resins. One of these flexibility imparting components can be used alone, or two or more thereof can be appropriately mixed and used.

The resin composition of the present embodiment can also comprise a silane coupling agent as an additional component for the purposes of improving the adhesiveness of the interface between the resin and the inorganic filler, and of improving moisture absorption heat resistance. Examples of the silane coupling agent include, for example, a vinylsilane-based silane coupling agent such as vinyltrimethoxysilane and γ-methacryloxypropyltrimethoxysilane; a phenylaminosilane-based silane coupling agent such as N-phenyl-3-aminopropyltrimethoxysilane; a phenylsilane-based silane coupling agent such as trimethoxyphenylsilane; and an imidazolesilane-based silane coupling agent. One of these silane coupling agents can be used alone, or two or more thereof can be appropriately mixed and used.

When the silane coupling agent is used, the content thereof is not particularly limited, and is preferably 0.05 parts by mass to 20 parts by mass based on 100 parts by mass in total of the bismaleimide compound (A) and the radical polymerizable resin or compound (B) according to the present embodiment, from the viewpoint of improving moisture absorption heat resistance and of reducing the amount of volatilization at the time of the flip chip bonding.

The resin composition of the present embodiment can also comprise a wetting and dispersing agent as an additional component for the purposes of improvement in the producibility of the laminate, dispersibility of the filler, and the like. The wetting and dispersing agent is not particularly limited as long as it is a wetting and dispersing agent that is used in general for a paint and the like. Examples thereof include, for example, Disperbyk (registered trademark) —110 (trade name), —111 (trade name), —180 (trade name), and —161 (trade name), BYK-W996 (trade name), —W9010 (trade name), and —W903 (trade name) manufactured by BYK Japan KK. One of these wetting and dispersing agents can be used alone, or two or more thereof can be appropriately mixed and used.

When the wetting and dispersing agent is used, content thereof is not particularly limited, and is preferably 0.1 parts by mass to 5 parts by mass, and more preferably 0.5 parts by mass to 3 parts by mass, based on 100 parts by mass of the inorganic filler (G) according to the present embodiment, from the viewpoint of improving the producibility of the laminate. Note that, when two or more wetting and dispersing agents are used in combination, it is preferable that their total amount satisfy the ratio described above.

The resin composition of the present embodiment may comprise a variety of additive agents as additional components for various purposes in the range in which the expected characteristics are not impaired. Examples of the additive agents include, for example, an ultraviolet absorbing agent, an antioxidant, a photopolymerization initiator, a fluorescent brightening agent, a photosensitizer, a dye, a pigment, a thickening agent, a lubricant, a defoaming agent, a leveling agent, a brightening agent, a flame retardant, and an ion trapping agent. The photopolymerization initiator is not particularly limited, and examples thereof include alkylphenone-based photopolymerization initiators; acylphosphine oxide-based photopolymerization initiators; and titanocene-based photopolymerization initiators. One of these additives can be used alone, or two or more thereof can be appropriately mixed and used.

In the resin composition of the present embodiment, the content of the additional component is not particularly limited, and is normally 0.01 parts by mass to 10 parts by mass based on 100 parts by mass in total of the bismaleimide compound (A) and the radical polymerizable resin or compound (B) according to the present embodiment.

Resin Composition

The resin composition of the present embodiment is excellent in balance of a low-void property, chip adhesiveness, tackiness, transmittivity and flux activity. When the resin composition of the present embodiment is used as an underfill material, preferably a pre-applied underfill material, for the use in the form of a laminate, it is not only excellent in balance of a low-void property, chip adhesiveness, tackiness, transmittivity and flux activity, but also excellent in joinability and insulation reliability. As described above, the resin composition of the present embodiment has a variety of excellent features, and is therefore more useful as an underfill material, and still more useful as a pre-applied underfill material. Note that the laminate will be mentioned later.

The resin composition of the present embodiment is prepared by appropriately mixing the bismaleimide compound (A), the radical polymerizable resin or compound (B) and the curing accelerator (C) such as the thermal radical polymerization initiator (D) and the imidazole compound (E), and if required, the thermosetting compound (F), the inorganic filler (G), the organic compound (H) having the flux function, and additional components. If required, the resin composition may be in the form of a varnish formed by dissolving or dispersing these components in an organic solvent. The varnish of the resin composition of the present embodiment can be suitably used as a varnish upon fabricating a laminate of the present embodiment, as described below. The organic solvent is not particularly limited as long as it can suitably dissolve or disperse each of the components described above and does not impair the expected effects of the resin composition of the present embodiment. Examples of the organic solvent include, for example, an alcohol such as methanol, ethanol, and propanol; a ketone such as acetone, methyl ethyl ketone (hereinafter, may be abbreviated as "MEK"), and methyl isobutyl ketone; an amide such as dimethylacetamide and dimethylformamide; and an aromatic hydrocarbon such as toluene and xylene. One of these organic solvents can be used alone, or two or more thereof can be appropriately mixed and used.

Resin Sheet

A resin sheet of the present embodiment contains the resin composition of the present embodiment. Specifically, the resin sheet of the present embodiment contains a supporting material, and a resin layer disposed on one surface or both surfaces of the supporting material, and the resin layer contains the resin composition of the present embodiment. This resin sheet is also referred to as a laminated resin sheet. The method for producing the resin sheet can be carried out according to an ordinary method, and is not particularly limited. For example, a solution obtained by dissolving the resin composition of the present embodiment in a solvent is applied to a supporting material, and dried to obtain the resin sheet.

The supporting material is not particularly limited, and examples thereof include organic-based films such as polyethylene films, polypropylene films, polycarbonate films, polyethylene terephthalate films, ethylene-tetrafluoroethylene copolymer films and polyimide films; release films obtained by applying a release agent to the surface of any of these films; conductor foils such as copper foils and aluminum foils; and plate-shaped materials such as glass plates, SUS plates and FRP.

The application method is not particularly limited, and examples thereof include a method in which a solution obtained by dissolving the resin composition of the present embodiment in a solvent is applied onto a supporting material by a bar coater, a die coater, a doctor blade, a baker applicator or the like.

Of the resin sheets of the present embodiment, a single-layer resin sheet is obtained by molding the resin composition of the present embodiment into a sheet shape. The method for producing the single-layer resin sheet can be carried out according to an ordinary method, and is not particularly limited. Examples of the method for producing the resin sheet of the present embodiment include a method in which a solution obtained by dissolving the resin composition of the present embodiment in a solvent is applied onto a supporting material, and dried, and the supporting material is peeled or etched off from the resin sheet. A solution obtained by dissolving the resin composition of the present embodiment in a solvent is supplied into a mold having a sheet-shaped cavity, and subjected to drying or the like to mold the resin composition into a sheet shape, whereby a single-layer resin sheet can be obtained without using a supporting material.

In fabrication of the resin sheet or the single-layer sheet of the present embodiment, the drying conditions for removing the solvent are not particularly limited, and it is preferable to perform drying at a temperature of 20° C. to 170° C. for 1 minute to 90 minutes because the solvent is likely to remain in the resin composition at low temperature and curing of the resin composition proceeds at high temperature.

The thickness of the resin sheet or the single-layer resin sheet of the present embodiment can be adjusted by the concentration and coating thickness of the solution of the resin composition of the present embodiment, and is not particularly limited, but is preferably 0.1 µm to 500 µm because a larger coating thickness typically allows the solvent to easily remain during drying.

The resin sheet or the single-layer resin sheet of the present embodiment can be used for production of, for example, a semiconductor wafer, substrates for mounting a semiconductor, and insulating layers of printed wiring boards.

Laminate

By applying the resin composition of the present embodiment onto a supporting material, a laminate can be provided which includes a layer containing a resin composition excellent in balance of a low-void property, chip adhesiveness, tackiness, transmittivity and flux activity. The laminate of the present embodiment contains a supporting material and a layer containing the resin composition of the present embodiment laminated on the supporting material. Such a laminate is obtained by spreading the resin composition of the present embodiment on a supporting material. As the supporting material, there is no particular limitation, and a polymer film can be used. Examples of the polymer film include films containing any of vinyl-based resins such as polyvinyl chloride, polyvinylidene chloride, polyethylene, polypropylene, polybutene, polybutadiene, ethylene-propylene copolymers, polymethylpentene, ethylene-vinyl acetate copolymers and ethylene-vinyl alcohol copolymers; polyester-based resins such as polyethylene terephthalate, polyethylene naphthalate and polybutylene terephthalate; polyurethane-based resins; polyimide-based resins; and polyamide-based resins, and mold releasing films obtained by applying a mold releasing agent to a surface of any of the abovementioned films. Among the above, polyester-based resins, polyimide-based resins and polyamide-based resins are preferable, and polyethylene terephthalate, which is one type of polyester-based resins, is more preferable.

Although the thickness of the supporting material is not particularly limited, and is preferably 10 µm to 100 µm from the viewpoint of easily producing a laminate, for example, stability of the coating thickness in the case of coating the supporting material with the resin composition, and of a conveyance property of the laminate. The lower limit of the thickness of the supporting material is more preferably 10 µm or more, still more preferably 20 µm or more, and yet even more preferably 25 µm or more from the standpoint of ensuring the yield upon producing the laminate. The upper limit of the thickness of the supporting material is more preferably 80 µm or less and is still more preferably 50 µm or less from the standpoint that the supporting material is peeled in the middle of the process and is not present in the end as a constituent member of the semiconductor device and from the standpoint of production costs of the laminate.

The method for producing the laminate of the present embodiment by forming a layer containing the resin composition of the present embodiment (hereinafter, also simply referred to as a "resin composition layer") on the supporting material is not particularly limited. Examples of such a production method include, for example, an approach in which the surface of the supporting material is coated with a varnish formed by dissolving or dispersing the resin composition of the present embodiment in an organic solvent, and dried under heating and/or reduced pressure, and the solvent is removed to solidify the resin composition of the present embodiment, thereby forming the resin composition layer. The drying conditions are not particularly limited, but the drying is carried out such that the content ratio of the organic solvent to the resin composition layer is usually 10 parts by mass or less, and preferably 5 parts by mass or less based on the total amount of the resin composition layer (100 parts by mass). Conditions for achieving such drying vary depending on the type of the organic solvent in the varnish and the amount to be compounded. For example, in the case of a varnish containing methyl ethyl ketone at 10 parts by mass to 650 parts by mass based on 100 parts by mass in total of the bismaleimide compound (A) and the radical polymerizable resin or compound (B) according to the present embodiment, the standard drying time is 2 minutes to 15 minutes under heating conditions of 90° C. to 160° C. at 1 atm. The thickness of the resin composition layer in the laminate of the present embodiment is not particularly limited, and is preferably in the range of 5 µm to 500 µm, and more preferably in the range of 10 µm to 100 µm from the viewpoint of removing volatile portions having a relatively low molecular weight in a better manner upon drying the resin composition layer and from the viewpoint of achieving functions as the laminate more effectively and reliably.

Semiconductor Wafer with Resin Composition Layer and Substrate for Mounting semiconductor with Resin Composition Layer A semiconductor wafer with a resin composition layer of the present embodiment contains: a semiconductor wafer; and the laminate of the present embodiment laminated on the semiconductor wafer, wherein the layer containing the resin composition is laminated on the semiconductor wafer. Also, a substrate for mounting a semiconductor with a resin composition layer of the present embodiment contains: a substrate for mounting a semiconductor; and the laminate of the present embodiment laminated on the substrate for mounting the semiconductor, wherein the layer containing the resin composition is laminated on the substrate for mounting the semiconductor.

The method for fabricating the semiconductor wafer with a resin composition layer of the present embodiment is not particularly limited, but for example, it is obtained by pasting the semiconductor wafer and the resin composition layer together such that the resin composition layer of the laminate of the present embodiment and the surface of the semiconductor wafer on which the electrodes have been formed, that is, the surface on which the joint with the substrate will take place, face each other. In addition, the method for fabricating the substrate for mounting the semiconductor with a resin composition layer of the present embodiment is not particularly limited, but for example, it is obtained by pasting the substrate for mounting the semiconductor and the resin composition layer together such that the resin composition layer of the laminate of the present embodiment and the surface of the substrate for mounting the semiconductor on which a chip is mounted face each other.

Although the method for pasting the laminate of the present embodiment and the semiconductor wafer or substrate for mounting the semiconductor together is not particularly limited, a vacuum pressing laminator can be suitably used. In this case, a method is preferable in which pressure is applied to the laminate of the present embodiment via an elastic body such as rubber, thereby pasting the laminate and the semiconductor wafer or substrate for mounting the semiconductor together. The lamination conditions are not particularly limited as long as they are conditions generally used in the art, and for example, the lamination is performed at a temperature of 50° C. to 140° C., with a contact pressure in the range of 1 kgf/cm$^2$ to 11 kgf/cm$^2$, and under an atmospheric reduced pressure of 20 hPa or less. Subsequently to the lamination step, smoothing of the pasted laminate may be performed through hot pressing with metal plates. The lamination step and the smoothing step can be performed sequentially with a commercially available vacuum pressing laminator. In the laminate stuck to the semiconductor wafer or substrate for mounting the semiconductor, removal of the supporting material is performed before the flip chip bonding of the chip in any case.

Semiconductor Device

A semiconductor device of the present embodiment contains the semiconductor wafer with a resin composition layer of the present embodiment and/or the substrate for mounting a semiconductor with a resin composition layer of the present embodiment. Although the method for producing the semiconductor device of the present embodiment is not particularly limited, and examples thereof include, for example, an approach in which the semiconductor wafer with a resin composition layer of the present embodiment is thinned with a grinding means or the like, and is divided into individual pieces with a dicing saw or the like to make the chip with the resin composition layer, which are then mounted on the substrate for mounting the semiconductor. In addition, the chip may be mounted on the substrate for mounting the semiconductor with a resin composition layer of the present embodiment. In the method for mounting the chip with the resin composition layer on the substrate for mounting the semiconductor and the method for mounting a semiconductor chip on the substrate for mounting the semiconductor with the resin composition layer, a flip chip bonder compatible with the thermocompression bonding method can be suitably used. In addition, although the case in which the chip is mounted on the substrate for mounting the semiconductor in the form of flip chip bonding is described for convenience in the present embodiment, the object to which the resin composition of the present embodiment is applied while mounting the chip in the form of flip chip bonding does not need to be a substrate for mounting the semiconductor. For example, the resin composition of the present embodiment may be used for a joint between a semiconductor wafer and a chip upon mounting the chip on the semiconductor wafer or for a joint between the chip of a chip laminate in which inter-chip connection is formed via TSV (Through Silicon Via) or the like, and in any case, the effects of the present invention can be obtained.

EXAMPLES

The present embodiment will be more specifically described below using Examples and Comparative Examples. The present embodiment is not limited in any way by the following Examples.

Fabrication of Resin Compositions and Laminates

Example 1

33.3 parts by mass of MIZ-001 ((trade name), manufactured by Nippon Kayaku Co., Ltd., a maleimide compound represented by the formula (27), which is a mixture where a in the formula (27) is 1 to 6 (integer)) as a bismaleimide compound (A); 13.4 parts by mass (6.7 parts by mass in terms of non-volatile portions) of a solution of bis-(3-ethyl-5-methyl-4-maleimidephenyl)methane (BMI-70 (trade name), manufactured by K•I Chemical Industry Co., LTD.) in methyl ethyl ketone (MEK) (non-volatile portions 50% by mass), 8.0 parts by mass (4.0 parts by mass in terms of non-volatile portions) of a solution of 2,2-bis(4-(4-maleimidephenoxy)phenyl)propane (BMI-80 (trade name), manufactured by K•I Chemical Industry Co., LTD.) in MEK (non-volatile portions 50% by mass), 2.7 parts by mass of a novolac-based maleimide compound represented by the formula (2) (BMI-2300 (trade name), manufactured by Daiwakasei Industry Co., LTD., unsaturated imide group equivalent 186 g/eq.) and 76.2 parts by mass (53.3 parts by mass in terms of non-volatile portions) of a maleimide compound represented by the formula (5) (MIR-3000-70MT (trade name), manufactured by Nippon Kayaku Co., Ltd., non-volatile portions 70% by mass) as radical polymerizable resins or compounds (B); 66.6 parts by mass (33.3 parts by mass) of a solution of P-d-based benzoxazine (manufactured by SHIKOKU CHEMICALS CORPORATION) in MEK (non-volatile portions 50% by mass) as a thermosetting compound (F); 26.7 parts by mass of a solution of a rosin-modified maleic acid resin (MALKYD No. 32 (trade name), manufactured by Arakawa Chemical Industries, Ltd.) in MEK (non-volatile portions 100% by mass) as a compound (H) having a flux function; 266.6 parts by mass (133.3 parts by mass in terms of non-volatile portions) of slurry silica (YA050C-MJE (trade name), solid content 50% by mass, average particle diameter: 50 nm, manufactured by Admatechs Company Limited) as an inorganic filler (G); 1.5 parts by mass of bis(1-methyl-1-phenylethyl)peroxide (dicumyl peroxide, manufactured by Kishida Chemical Co., Ltd., 10 hour half-life period temperature: 116.4° C.) as a thermal radical polymerization initiator (D); and 4.0 parts by mass of 2-ethyl-4-methylimidazole (2E4MZ, manufactured by SHIKOKU CHEMICALS CORPORATION) as an imidazole compound (E) were mixed, and stirred for 40 minutes with a high speed stirring apparatus to obtain a varnish (amount of MEK: 202.8 parts by mass). This varnish was applied to a 38 µm-thick polyethylene terephthalate film (TR1-38, (trade name, supporting material) manufactured by UNITIKA LTD.), the surface of which was coated with a mold releasing agent, followed by performing drying by heating at 100° C. for 5 minutes at 1 atm to obtain a laminate with a resin composition layer having a thickness of 30 µm.

Example 2

A varnish was prepared in the same manner as in Example 1 except that the amount of the maleimide compound represented by the formula (5) (MIR-3000-70MT (trade name)) was changed from 76.2 parts by mass (53.3 parts by mass in terms of non-volatile portions) to 57.1 parts by mass (40.0 parts by mass in terms of non-volatile portions), and the amount of the bismaleimide compound (A) (MIZ-001 (trade name)) was changed from 33.3 parts by mass to 46.6 parts by mass. By using this varnish, a laminate with a resin composition layer having a thickness of 30 µm was obtained in the same manner as in Example 1.

Example 3

A varnish was prepared in the same manner as in Example 1 except that the amount of the maleimide compound represented by the formula (5) (MIR-3000-70MT (trade name)) was changed from 76.2 parts by mass (53.3 parts by mass in terms of non-volatile portions) to 38.1 parts by mass (26.7 parts by mass in terms of non-volatile portions), and the amount of the bismaleimide compound (A) (MIZ-001 (trade name)) was changed from 33.3 parts by mass to 59.9 parts by mass. By using this varnish, a laminate with a resin composition layer having a thickness of 30 μm was obtained in the same manner as in Example 1.

Example 4

A varnish was prepared in the same manner as in Example 1 except that the maleimide compound represented by the formula (5) (MIR-3000-70MT (trade name)) was not added, and the amount of the bismaleimide compound (A) (MIZ-001 (trade name)) was changed from 33.3 parts by mass to 86.6 parts by mass. By using this varnish, a laminate with a resin composition layer having a thickness of 30 μm was obtained in the same manner as in Example 1.

Example 5

A varnish was prepared in the same manner as in Example 1 except that the amount of the maleimide compound represented by the formula (5) (MIR-3000-70MT (trade name)) was changed from 76.2 parts by mass (53.3 parts by mass in terms of non-volatile portions) to 109.6 parts by mass (76.7 parts by mass in terms of non-volatile portions), and the amount of the bismaleimide compound (A) (MIZ-001 (trade name)) was changed from 33.3 parts by mass to 9.9 parts by mass. By using this varnish, a laminate with a resin composition layer having a thickness of 30 μm was obtained in the same manner as in Example 1.

Example 6

A varnish was prepared in the same manner as in Example 1 except that the amount of the maleimide compound represented by the formula (5) (MIR-3000-70MT (trade name)) was changed from 76.2 parts by mass (53.3 parts by mass in terms of non-volatile portions) to 23.9 parts by mass (16.7 parts by mass in terms of non-volatile portions), and the amount of the bismaleimide compound (A) (MIZ-001 (trade name)) was changed from 33.3 parts by mass to 69.9 parts by mass. By using this varnish, a laminate with a resin composition layer having a thickness of 30 μm was obtained in the same manner as in Example 1.

Comparative Example 1

A varnish was prepared in the same manner as in Example 1 except that 33.3 parts by mass of a maleimide compound represented by the formula (3) (BMI-1000P (trade name), manufactured by K•I Chemical Industry Co., LTD.) was added instead of 33.3 parts by mass of the bismaleimide compound (A) (MIZ-001 (trade name)). By using this varnish, a laminate with a resin composition layer having a thickness of 30 μm was obtained in the same manner as in Example 1.

Comparative Example 2

A varnish was prepared in the same manner as in Example 1 except that 33.3 parts by mass of a bismaleimide compound represented by the formula (28) (BMI-3000 (trade name), manufactured by Designer Molecules Inc., a mixture where n is in the range of 1 to 20) was added instead of 33.3 parts by mass of the bismaleimide compound (A) (MIZ-001 (trade name)). Subsequently, an attempt was made to prepare a laminate in the same manner as in Example 1, but it was not possible to form a laminate including a resin composition layer having a uniform thickness because of high varnish viscosity and poor moldability.

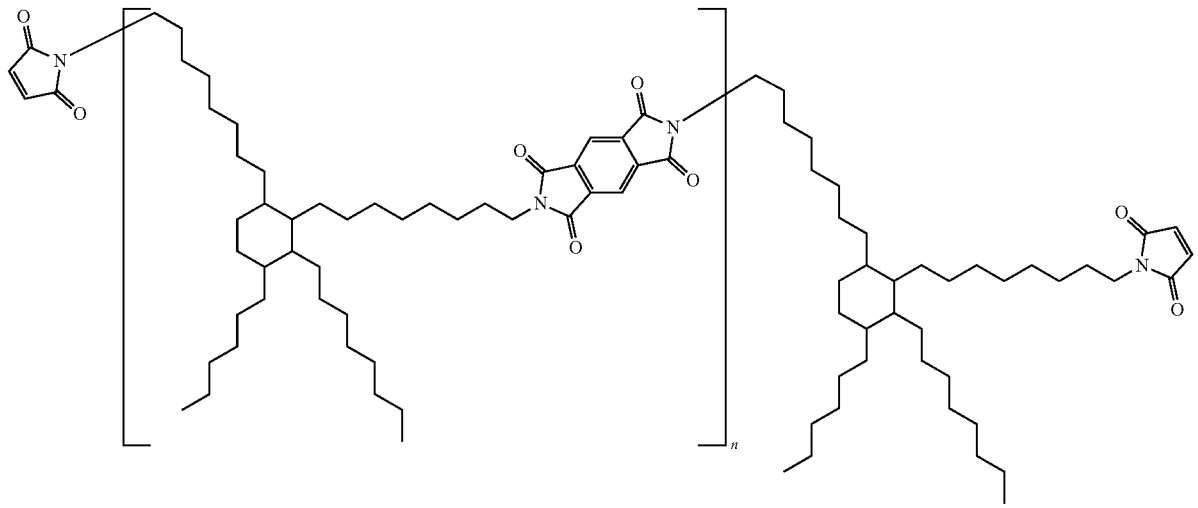

(28)

Evaluation of Laminates (1) Tackiness

The laminate obtained in Example 1 was cut into a width of 2.5 cm and a length of 5 cm to prepare a sample. At room temperature, a weight made of SUS (bottom area 10 cm² (=2 cm×5 cm), weight 500 g, manufactured by MURAKAMI KOKI Co., Ltd.) was placed on the surface of the resin composition layer in the sample for 30 seconds, and the weight was lifted up. Here, the sample was evaluated as A (having no tackiness) when sticking did not occur, and the sample was evaluated as C (having tackiness) when sticking occurred. For the laminate obtained in Examples 2 to 6 and Comparative Example 1, samples were similarly prepared, and the tackiness was evaluated. Table 1 shows the results.

(2) Transmittance

The laminate obtained in Example 1 was cut into a width of 5 cm and a length of 5 cm to prepare a sample. The transmittance of the sample at 624 nm was measured at room temperature with a spectroscopic colorimeter (SD6000 (trade name), manufactured by JASCO Corporation). The sample was evaluated as A when the transmittance at 624 nm was 80% or more, and the sample was evaluated as B when the transmittance was less than 80%. In addition, for the laminates obtained in Examples 2 to 6 and Comparative Example 1, samples were similarly prepared, and the transmittances were evaluated. Table 1 shows the results. When the transmittance is 80% or more, it is possible to read alignment marks on a substrate to which the laminate is stuck, and a semiconductor chip, and a laminate which enables registration at the time of performing lamination can be obtained.

(3) Voids

The laminate obtained in Example 1 was cut into a square of 8 mm×8 mm, and the resin composition layer in the laminate after the cutting was stacked and laminated on a 15 μm copper circuit surface of the pad portion of a substrate for mounting a semiconductor (WALTS-KIT MB50-0102JY (trade name) manufactured by WALTS CO., LTD.). Thereafter, the polyethylene terephthalate film was peeled. Thereafter, by using a flip chip bonder (LFB-2301 (trade name), manufactured by SHINKAWA LTD.), the resin composition layer on the peeled surface was bonded by thermocompression onto the semiconductor chip having a Cu pillar constituted with copper and solder as an electrode were bonded thereto under conditions with a stage temperature of 70° C., a bond head temperature of 260° C., a load of 50 N, and a time of 6 seconds, thereby performing bonding. For the samples after the bonding, the presence or absence of voids in the resin composition layer within the range of the semiconductor chip bonding area was confirmed using an ultrasonic flaw detection imaging device (μ-SDS (trade name), manufactured by KJTD Co., Ltd). The sample was evaluated as A when the ratio of voids to the entire resin composition layer in the range of the semiconductor chip bonding portion was less than 10%, the sample was evaluated as B when the ratio of voids was 10% or more and less than 30%, and the sample was evaluated as C when the ratio of voids was 30% or more. In addition, for the laminates obtained in Examples 2 to 6 and Comparative Example 1, samples were similarly prepared, and the ratios of voids were evaluated. Table 1 shows the results. When the ratio of voids was less than 10%, a laminate having high insulation reliability can be obtained.

(4) Chip Adhesiveness

The laminate obtained in Example 1 was cut into a square of 8 mm×8 mm, and the resin composition layer in the laminate after the cutting was stacked and laminated on a 15 μm copper circuit surface of the pad portion of a substrate for mounting a semiconductor (WALTS-KIT MB50-0102JY (trade name) manufactured by WALTS CO., LTD.). Thereafter, the polyethylene terephthalate film was peeled. Thereafter, by using a flip chip bonder (LFB-2301 (trade name), manufactured by SHINKAWA LTD.), the resin composition layer on the peeled surface was bonded by thermocompression onto the semiconductor chip having a Cu pillar constituted with copper and solder as an electrode were bonded thereto under conditions with a stage temperature of 70° C., a bond head temperature of 260° C., a load of 50 N, and a time of 6 seconds, thereby performing bonding. The cross section at the central portion of the sample after the bonding (a semiconductor chip/resin composition layer/substrate for evaluation) was cut out, and peeling at interfaces between the semiconductor chip and the resin composition layer on the cross section was examined by using a scanning electron microscope (JCM-6000 Plus (trade name), manufactured by JEOL Ltd.) The sample was evaluated as A when the ratio of peeling to the entire interfaces between the semiconductor chip and the resin composition layer was less than 1%, the sample was evaluated as B when the ratio of peeling was 1% or more and less than 20%, and the sample was evaluated as C when the ratio of peeling was 20% or more. In addition, for the laminates obtained in Examples 2 to 6 and Comparative Example 1, samples were similarly prepared, and the ratios of peeling were evaluated. Table 1 shows the results. When the ratio of peeling was less than 1%, a laminate having high insulation reliability can be obtained.

(5) Evaluation of Flexibility

The laminate obtained in Example 1 was cut into a width of 10 mm and a length of 20 cm to prepare a sample. At room temperature, the sample was wound around a round bar having an outer diameter of 20 mm (Stainless Round Bar, manufactured by ESCO Co., Ltd.) such that the supporting material (polyethylene terephthalate film) in this sample was placed inside, and the sample was retained for 10 seconds, then unwound, and unfolded. After this operation was repeated 10 times, the presence or absence of cracks in the resin composition layer in the sample was visually confirmed, thereby performing evaluation of flexibility. The sample was evaluated as A when cracks did not occur at all (good bendability), the sample was evaluated as B when cracks partially occurred, and the sample was evaluated as C when cracks occurred over the entire surface. In addition, for the laminates obtained in Examples 2 to 6 and Comparative Example 1, samples were similarly prepared, and the flexibility was evaluated. Table 1 shows the results.

TABLE 1

| Evaluation | Example 1 | Example 2 | Example 3 | Example 4 | Example 5 | Example 6 | Comparative Example 1 |
|---|---|---|---|---|---|---|---|
| Tackiness | A | A | A | A | A | A | C |
| Transmittance | A | A | A | A | A | A | A |
| Void | A | A | A | B | B | A | C |
| Chip adhesiveness | A | A | A | A | B | A | C |
| Evaluation on flexibility | A | A | A | B | A | A | C |

The present application is based on Japanese Patent Application No. 2019-122395 filed on Jun. 28, 2019, the contents of which are incorporated herein by reference.

INDUSTRIAL APPLICABILITY

As described above, the resin composition of the present embodiment is excellent in balance of a low-void property, chip adhesiveness, tackiness, transmittivity and flux activity, and is thus suitably used as a material for resin sheets, laminates, a semiconductor wafer, substrates for mounting a semiconductor, and a semiconductor device. In particular, the resin composition is suitable as an underfill material, and more suitable as a pre-applied underfill material. In addition, since the resin composition of the present embodiment is excellent in flux activity, it can impart high reliability that can withstand use for a long period of time in laminates obtained through joining between a chip and substrate, the joint between a chip and a semiconductor wafer, and the joint between a chip and a chip.

The invention claimed is:

1. A resin composition comprising:
a bismaleimide compound (A) containing a constituent unit represented by the following formula (1), and maleimide groups at both ends of the molecular chain;
a radical polymerizable resin or compound (B) other than the bismaleimide compound (A); and
a curing accelerator (C),
wherein the radical polymerizable resin or compound (B) contains at least one selected from the group consisting of a citraconimide group, a vinyl group, a maleimide group, a (meth)acryloyl group and an allyl group:

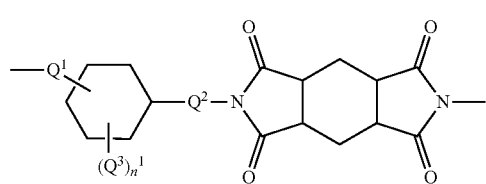

(1)

wherein $Q^1$ represents a linear or branched alkylene group having 1 to 16 carbon atoms, or a linear or branched alkenylene group having 2 to 16 carbon atoms; $Q^2$ represents a linear or branched alkylene group having 1 to 16 carbon atoms, or a linear or branched alkenylene group having 2 to 16 carbon atoms; each $Q^3$ independently represents a hydrogen atom, a linear or branched alkyl group having 1 to 16 carbon atoms, or a linear or branched alkenyl group having 2 to 16 carbon atoms; and each $n^1$ independently represents an integer of 1 to 10.

2. The resin composition according to claim 1, wherein the radical polymerizable resin or compound (B) contains a maleimide group.

3. The resin composition according to claim 1, wherein the radical polymerizable resin or compound (B) contains at least one selected from 2,2-bis[4-(4-maleimidophenoxy)phenyl]propane, a maleimide compound represented by the following formula (2), a maleimide compound represented by the following formula (3), a maleimide compound represented by the following formula (4), a maleimide compound represented by the following formula (5), a compound represented by the following formula (6), a compound represented by the following formula (7), a compound represented by the following formula (10), a compound represented by the following formula (11), a compound represented by the following formula (12), and a compound represented by the following formula (13):

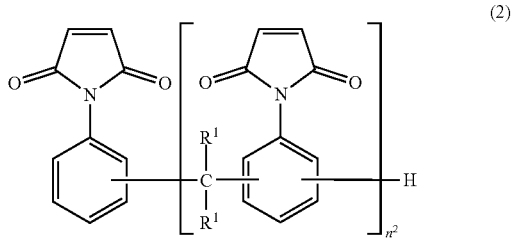

(2)

wherein each $R^1$ independently represents a hydrogen atom or a methyl group, and $n^2$ represents an integer of 1 to 10;

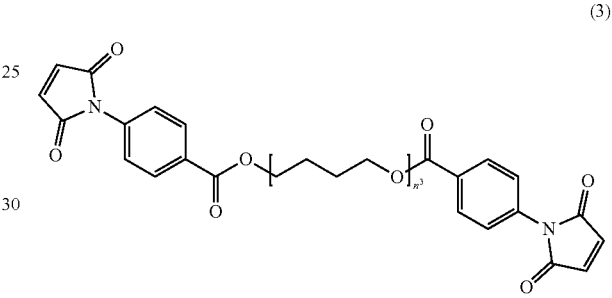

(3)

wherein $n^3$ represents an integer of 1 to 30;

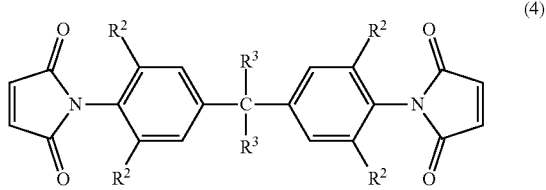

(4)

wherein each $R^2$ independently represents a hydrogen atom, a methyl group, or an ethyl group; and each $R^3$ independently represents a hydrogen atom or a methyl group;

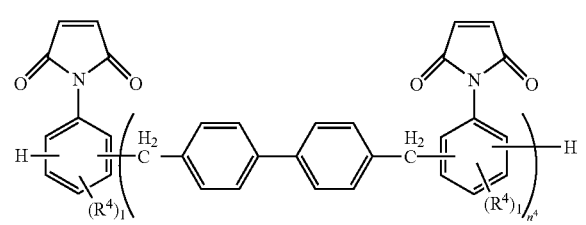

(5)

wherein each $R^4$ independently represents a hydrogen atom, an alkyl group having 1 to 5 carbon atoms, or a phenyl group; each $l$ independently represents an integer of 1 to 3; and $n^4$ represents an integer of 1 to 10;

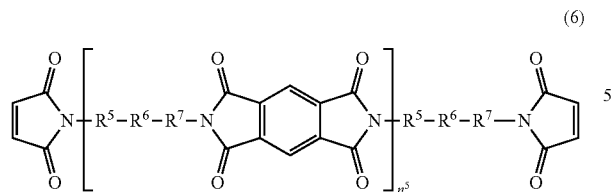

(6)

wherein $R^5$ and $R^7$ each independently represent a hydrocarbon group in which 8 or more atoms are linearly linked; each $R^6$ independently represents a substituted or unsubstituted cyclic hydrocarbon group optionally having a heteroatom in which 4 to 10 atoms constitute the ring; and $n^5$ represents an integer of 1 to 10;

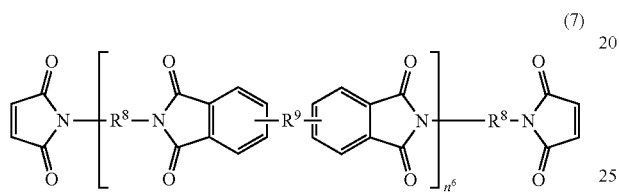

(7)

wherein each $R^8$ independently represents an alkylene group; each $R^9$ independently represents an alkylene group, a group represented by the following formula (8), a group represented by the formula "—$SO_2$—", a group represented by the formula "—CO—", a group represented by the following formula (9), an oxygen atom, or a single bond; and $n^6$ represents an integer of 1 to 10;

(8)

wherein Z is an alkylene group or a hydrocarbon group having 6 to 30 carbon atoms and having an aromatic ring; and $n^7$ represents an integer of 0 to 5;

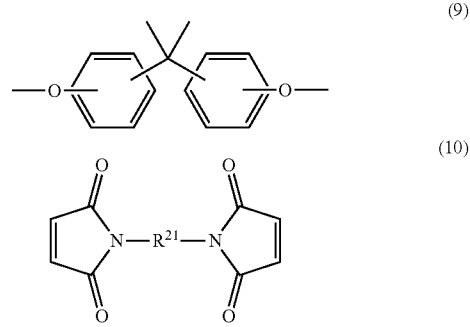

(9)

(10)

wherein $R^{21}$ represents at least one selected from a linear or branched alkylene group having 1 to 40 carbon atoms, a cyclic hydrocarbon group optionally having a heteroatom in which 3 to 20 atoms constitute the ring, an oxygen atom, a group represented by "—NH—", a sulfur atom, and a group represented by the formula "—$SO_2$—";

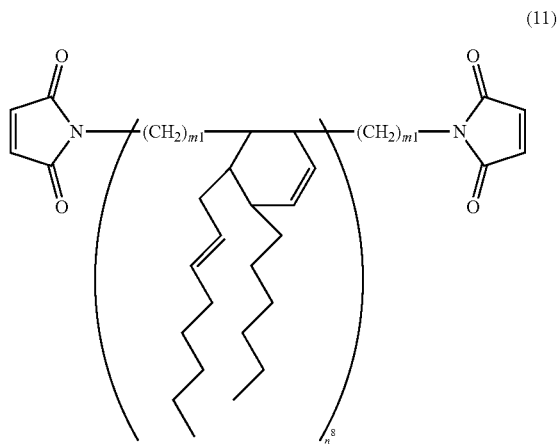

(11)

wherein $n^8$ represents an integer of 1 to 10; and m1 represents an integer of 8 to 40;

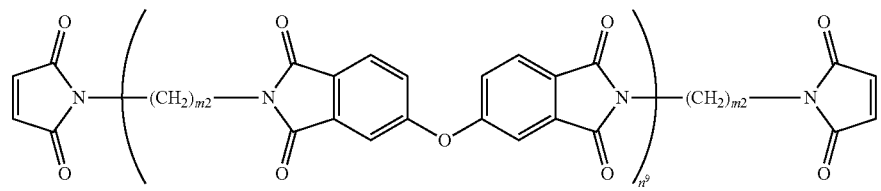

(12)

wherein n° represents an integer of 1 to 10; and m2 represents an integer of 8 to 40; and

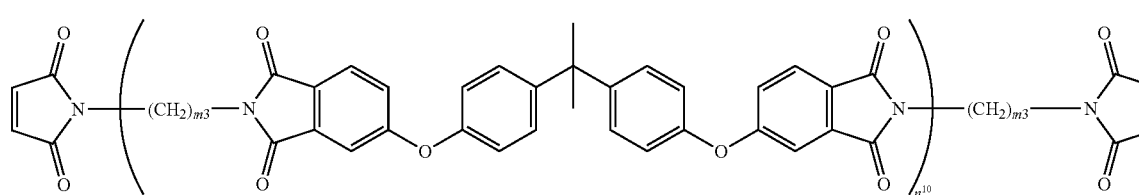

(13)

wherein $n^{10}$ represents an integer of 1 to 10; and m3 represents an integer of 8 to 40.

4. The resin composition according to claim 1, wherein the curing accelerator (C) contains at least one selected from the group consisting of a thermal radical polymerization initiator (D) and an imidazole compound (E).

5. The resin composition according to claim 4, wherein the thermal radical polymerization initiator (D) has a 10 hour half-life period temperature of 100° C. or higher.

6. The resin composition according to claim 4, wherein the thermal radical polymerization initiator (D) contains an organic peroxide.

7. The resin composition according to claim 4, wherein the thermal radical polymerization initiator (D) has a peroxy ester, a peroxy ketal, a dialkyl peroxide, or a hydroperoxide skeleton.

8. The resin composition according to claim 4, wherein the thermal radical polymerization initiator (D) contains at least one selected from dicumyl peroxide, di(2-tert-butylperoxyisopropyl)benzene, 1,1,3,3-tetramethylbutyl hydroperoxide, 2,5-dimethyl-2,5-bis(tert-butylperoxy) hexyne-3, and tert-butyl hydroperoxide.

9. The resin composition according to claim 1, wherein a content of the bismaleimide compound (A) is 1 part by mass to 99 parts by mass based on 100 parts by mass in total of the bismaleimide compound (A) and the radical polymerizable resin or compound (B).

10. The resin composition according to claim 1, wherein a content of the curing accelerator (C) is 0.05 parts by mass to 10 parts by mass based on 100 parts by mass in total of the bismaleimide compound (A) and the radical polymerizable resin or compound (B).

11. The resin composition according to claim 1, further comprising a thermosetting compound (F) other than the bismaleimide compound (A) and the radical polymerizable resin or compound (B).

12. The resin composition according to claim 11, wherein the thermosetting compound (F) has a molecular weight of 400 or more.

13. The resin composition according to claim 11, wherein the thermosetting compound (F) contains a benzoxazine compound.

14. The resin composition according to claim 13, wherein the benzoxazine compound contains at least one selected from a compound represented by the following formula (14), a compound represented by the following formula (15), a compound represented by the following formula (16) and a compound represented by the following formula (17):

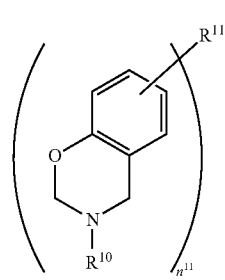

(14)

wherein, $R^{10}$ represents an aryl group, an aralkyl group, an alkenyl group, an alkyl group, or a cycloalkyl group; $R^{11}$ represents a hydrogen atom, an aryl group, an aralkyl group, an alkenyl group, an alkyl group, a cycloalkyl group, or a monovalent to tetravalent organic group represented by the following general formulas (a) to (t); and $n^{11}$ represents an integer of 1 to 4;

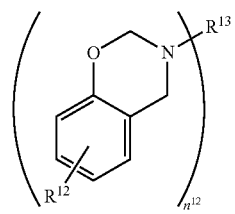

(15)

wherein $R^{12}$ represents a hydrogen atom, an aryl group, an aralkyl group, an alkenyl group, an alkyl group, or a cycloalkyl group; $R^{13}$ represents an aryl group, an aralkyl group, an alkenyl group, an alkyl group, a cycloalkyl group, or a monovalent to tetravalent organic group represented by the following general formulas (a) to (t); and $n^{12}$ represents an integer of 1 to 4;

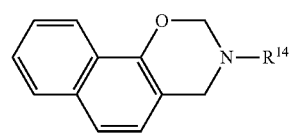

(16)

wherein $R^{14}$ represents an alkyl group, a cycloalkyl group, or a phenyl group optionally having a substituent;

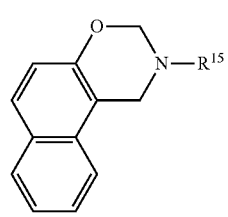

(17)

wherein $R^{15}$ represents an alkyl group, a cycloalkyl group, or a phenyl group optionally having a substituent; and

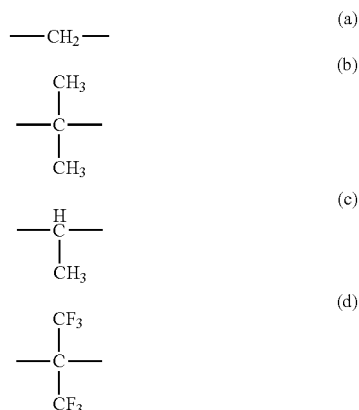

-continued (e) 

(f) 

(g) 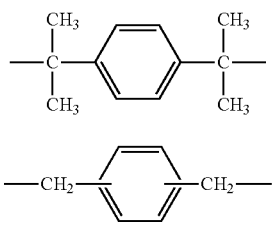

(h) 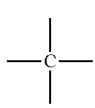

(i) 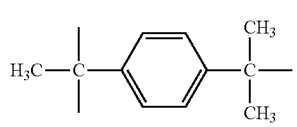

(j) 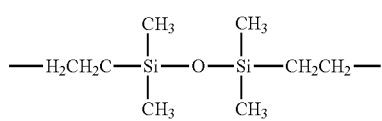

(k) 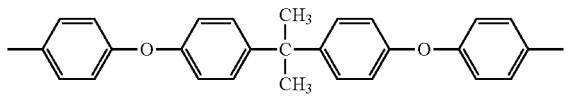

(l) 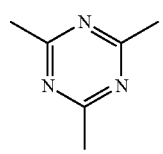

(m) 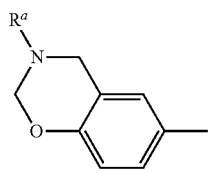

(n) 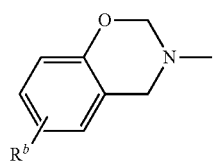

(o) 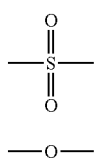

(p)

$$\overset{O}{\underset{O}{\parallel}}{\underset{\parallel}{S}}$$

(q) —O—

(r) 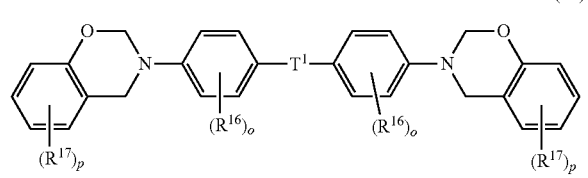

(s)

(t)

wherein $R^a$ represents an aryl group, an aralkyl group, an alkenyl group, an alkyl group, or a cycloalkyl group; and $R^b$ represents a hydrogen atom, an aryl group, an aralkyl group, an alkenyl group, an alkyl group, or a cycloalkyl group.

15. The resin composition according to claim 13, wherein the benzoxazine compound contains at least one selected from a compound represented by the following formula (18), a compound represented by the following formula (19), and a compound represented by the following formula (20):

(18)

wherein each $R^{16}$ independently represents a hydrogen atom, an aryl group, an aralkyl group, an alkenyl group, an alkyl group, or a cycloalkyl group; each o independently represents an integer of 1 to 4; each $R^{17}$ independently represents a hydrogen atom, an aryl group, an aralkyl group, an alkenyl group, an alkyl group, or a cycloalkyl group; each p independently represents an integer of 1 to 4; and $T^1$ represents an alkylene group, a group represented by the following formula (8), a group represented by the formula "—$SO_2$—", a group represented by the formula "—CO—", an oxygen atom, or a single bond;

(19)

wherein each $R^{18}$ independently represents a hydrogen atom, an aryl group, an aralkyl group, an alkenyl group, an alkyl group, or a cycloalkyl group; each q independently represents an integer of 1 to 3; each $R^{19}$ independently represents a hydrogen atom, an aryl group, an aralkyl group, an alkenyl group, an alkyl group, or a cycloalkyl group; each r independently represents an integer of 1 to 5; and $T^2$ represents an alkylene group, a group represented by the following formula (8), a group represented by the formula "—SO$_2$—", a group represented by the formula "—CO—", an oxygen atom, or a single bond;

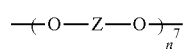
(8)

wherein Z is an alkylene group or a hydrocarbon group having 6 to 30 carbon atoms and having an aromatic ring; and $n^7$ represents an integer of 0 to 5;

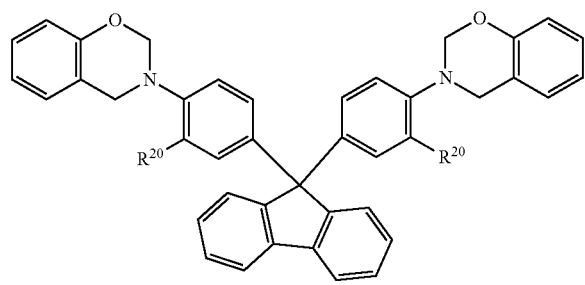
(20)

wherein each $R^{20}$ independently represents a hydrogen atom or a hydrocarbon group having 1 to 4 carbon atoms.

16. The resin composition according to claim 15, wherein the compound represented by the formula (18) contains a compound represented by the following formula (21) and/or a compound represented by the following formula (22), and the compound represented by the formula (19) contains at least one selected from a compound represented by the following formula (23), a compound represented by the following formula (24), and a compound represented by the following formula (25):

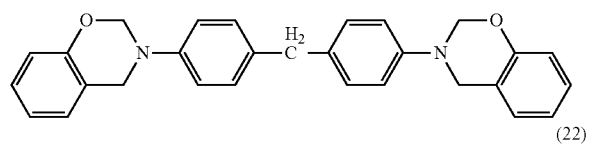
(21)

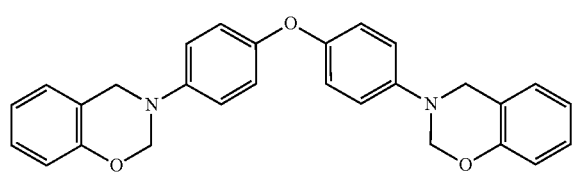
(22)

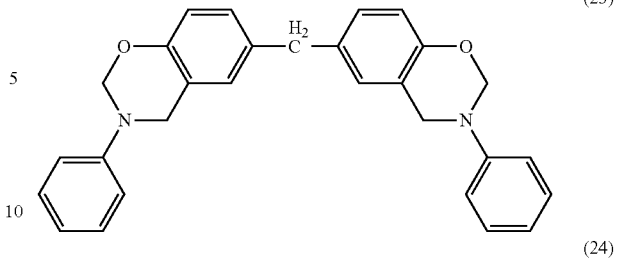
(23)

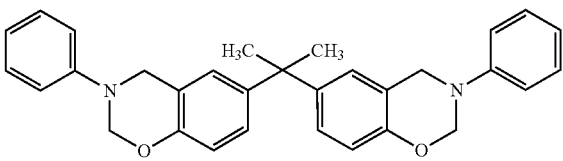
(24)

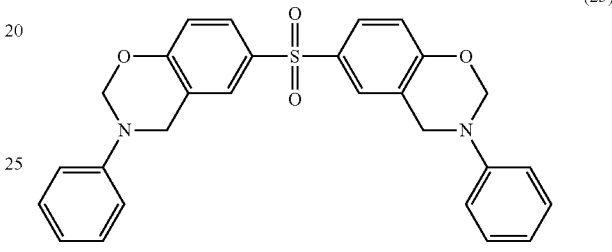
(25)

17. The resin composition according to claim 11, wherein a content of the thermosetting compound (F) is 1 part by mass to 99 parts by mass based on 100 parts by mass in total of the bismaleimide compound (A) and the radical polymerizable resin or compound (B).

18. The resin composition according to claim 1, further comprising an inorganic filler (G).

19. The resin composition according to claim 18, wherein the inorganic filler (G) has an average particle diameter of 3 μm or less.

20. The resin composition according to claim 18, wherein the inorganic filler (G) contains at least one selected from silica, aluminum hydroxide, alumina, boehmite, boron nitride, aluminum nitride, magnesium oxide, and magnesium hydroxide.

21. The resin composition according to claim 18, wherein the inorganic filler (G) is silica.

22. The resin composition according to claim 18, wherein a content of the inorganic filler (G) is 500 parts by mass or less based on 100 parts by mass in total of the bismaleimide compound (A) and the radical polymerizable resin or compound (B).

23. The resin composition according to claim 1, further comprising an organic compound (H) having a flux function.

24. The resin composition according to claim 23, wherein a content of the organic compound (H) having the flux function is 1 part by mass to 60 parts by mass based on 100 parts by mass in total of the bismaleimide compound (A) and the radical polymerizable resin or compound (B).

25. An underfill material comprising the resin composition according to claim 1.

26. A pre-applied underfill material comprising the resin composition according to claim 1.

27. A resin sheet comprising the resin composition according to claim 1.

28. A laminate comprising:
a supporting material; and
a layer containing the resin composition according to claim 1 laminated on the supporting material.

29. A semiconductor wafer with a resin composition layer, comprising:
a semiconductor wafer; and
further comprising the laminate according to claim 28,
wherein the layer containing the resin composition is laminated on the semiconductor wafer.

30. A substrate for mounting a semiconductor with a resin composition layer, comprising:
a substrate for mounting the semiconductor; and
further comprising the laminate according to claim 28,
wherein the layer containing the resin composition is laminated on the substrate for mounting the semiconductor.

31. A semiconductor device comprising the semiconductor wafer with a resin composition layer according to claim 29.

32. A semiconductor device comprising the substrate for mounting the semiconductor with a resin composition layer according to claim 30.

\* \* \* \* \*